US011246247B2

(12) United States Patent
Choi et al.

(10) Patent No.: US 11,246,247 B2
(45) Date of Patent: Feb. 8, 2022

(54) ELECTROMAGNETIC INTERFERENCE SHIELDING FILM HAVING A LAMINATED STRUCTURE INCLUDING A STACK OF METAL NANOPLATES AND A NANO ELECTRODE INCLUDING THE SAME

(71) Applicant: KOREA INSTITUTE OF SCIENCE AND TECHNOLOGY, Seoul (KR)

(72) Inventors: Ho-Koang Choi, Jeollabuk-do (KR); Byung Joon Moon, Jeollabuk-do (KR); Dong Su Lee, Jeollabuk-do (KR); Sukang Bae, Jeollabuk-do (KR); Seoung-Ki Lee, Jeollabuk-do (KR); Sang Hyun Lee, Jeollabuk-do (KR); Tae-Wook Kim, Jeollabuk-do (KR)

(73) Assignee: Korea Institute of Science and Technology, Seoul (KR)

( * ) Notice: Subject to any disclaimer, the term of this patent is extended or adjusted under 35 U.S.C. 154(b) by 6 days.

(21) Appl. No.: 16/630,104

(22) PCT Filed: Dec. 24, 2018

(86) PCT No.: PCT/KR2018/016584
§ 371 (c)(1),
(2) Date: Jan. 10, 2020

(87) PCT Pub. No.: WO2019/135533
PCT Pub. Date: Jul. 11, 2019

(65) Prior Publication Data
US 2020/0163261 A1     May 21, 2020

(30) Foreign Application Priority Data

Jan. 5, 2018    (KR) .................. 10-2018-0001674
Dec. 10, 2018    (KR) .................. 10-2018-0158285

(51) Int. Cl.
    *H05K 9/00*       (2006.01)
    *H01B 13/30*     (2006.01)
    *H01B 13/22*     (2006.01)

(52) U.S. Cl.
    CPC ......... *H05K 9/0083* (2013.01); *H01B 13/228* (2013.01); *H01B 13/30* (2013.01)

(58) Field of Classification Search
    CPC .................................................. H05K 9/0083
    See application file for complete search history.

(56) References Cited

U.S. PATENT DOCUMENTS

2008/0315466 A1* 12/2008 Hood .................. B29C 70/46
                                                                       264/479
2009/0277680 A1    11/2009   Lee et al.
(Continued)

FOREIGN PATENT DOCUMENTS

JP       2016-527664 A     9/2016
KR    10-2010-0033950 A     3/2010
(Continued)

OTHER PUBLICATIONS

Faisal Shahzad et al., "Electromagnetic interference shielding with 2D transition metal carbides (MXenes)", Science, 2016, pp. 1137-1140, vol. 353, Issue 6304.
(Continued)

*Primary Examiner* — Hung V Ngo
(74) *Attorney, Agent, or Firm* — Rabin & Berdo, P.C.

(57) ABSTRACT

An electromagnetic wave shielding film includes a substrate; and an electromagnetic wave shielding layer disposed on the substrate and including a laminated structure having a planar shape and including a stack of metal nanoplates, wherein each metal nanoplate of the stack of metal nanoplates is staggered with respect to one or more other metal nanoplate of the stack of metal nanoplates so that the laminated
(Continued)

structure has pores defined therein and between laminated structures in a stack of laminates structures. An additional embodiment of an electromagnetic wave shielding film includes an electromagnetic wave shielding layer including a composite of a polymer resin matrix composed of a polymer and at least one metal nanoplate, wherein each metal nanoplate of the at least one metal nanoplate is staggered with respect to one or more other metal nanoplate of the at least one metal nanoplate so that the composite has pores defined therein.

15 Claims, 35 Drawing Sheets

(56) References Cited

U.S. PATENT DOCUMENTS

| | | |
|---|---|---|
| 2011/0262702 A1 | 10/2011 | Kim et al. |
| 2016/0137865 A1 | 5/2016 | Kwon et al. |
| 2018/0162098 A1 | 6/2018 | Joo |

FOREIGN PATENT DOCUMENTS

| | | |
|---|---|---|
| KR | 10-1458742 B1 | 11/2014 |
| KR | 10-2014-0145811 A | 12/2014 |
| KR | 10-1749460 B1 | 6/2017 |
| KR | 10-2017-0076361 A | 7/2017 |

OTHER PUBLICATIONS

Mohammed H. Al-Saleh et al., "Copper nanowire/polystyrene nanocomposites: Lower percolation threshold and higher EMI shielding", Composites: Part A, 2011, pp. 92-97, vol. 42.

Bin Shen et al., "Ultrathin Flexible Graphene Film: An Excellent Thermal Conducting Material with Efficient EMI Shielding", Advanced Functional Materials, 2014, pp. 4542-4548, vol. 24.

Mingming Sun et al., "A flexible conductive film prepared by the oriented stacking of Ag and Au/Ag alloy nanoplates and its chemically roughened surface for explosive SERS detection and cell adhesion", RSC Advances, 2017, pp. 7073-7078, vol. 7.

Nandho Rahmansyah et al., "Non-isothermal crystallization of poly(ethylene oxide)/silver nanoplate composites", Polymer International, 2011, pp. 1380-1389, vol. 60.

Jin-Won Lee et al., "2D Single-Crystalline Copper Nanoplates as a Conductive Filler for Electronic Ink Applications", Small, 2017, No. 1703312, vol. 14, Issue 8.

* cited by examiner

ELECTROMAGNETIC INTERFERENCE SHIELDING FILM HAVING A LAMINATED STRUCTURE INCLUDING A STACK OF METAL NANOPLATES AND A NANO ELECTRODE INCLUDING THE SAME

CROSS-REFERENCE TO RELATED APPLICATION

This application claims priority to Korean Patent Application No. 10-2018-0001674, filed on Jan. 5, 2018 and Korean Patent Application No. 10-2018-0158285, filed on Dec. 10, 2018, and all the benefits accruing therefrom under 35 U.S.C. § 119, the contents of which in its entirety are herein incorporated by reference.

TECHNICAL FIELD

Disclosed relates to a method of manufacturing a new electromagnetic wave shielding film.

BACKGROUND ART

Due to the miniaturization of electronic products and the development of information and communication devices, the pollution caused by electromagnetic waves in everyday life is increasing. These electromagnetic waves cause a malfunction or system errors of peripheral devices, and can cause diseases in the human body, which are directly affected thereby. As a result, the development of electromagnetic wave shielding technology is becoming very important.

Accordingly, there is a growing demand for electromagnetic wave shielding films for shielding electromagnetic waves attached to electronic products. The electromagnetic wave shielding ability of such electromagnetic wave shielding films may be represented by the efficiency of electromagnetic wave shielding, and specifically, may be represented by the internal absorption of the electromagnetic wave, surface reflection of the electromagnetic wave, and sum of the losses through multi-reflection.

On the other hand, the conventional electromagnetic wave shielding film is manufactured to include a conductive film containing a metal material, which is a conductive material, mainly through a plating process. In this case, there are problems in that the processability of the electromagnetic wave shielding film is lowered and the price competitiveness is lowered.

Accordingly, various materials for use in electromagnetic wave shielding films as substitutes for existing metal materials have been studied, and process conditions using them are also being studied.

CITATION LIST

Non Patent Literature

[Non Patent Literature 1] Faisal Shahzad et al. Mater. Sci, 353 (6304), 1137-1140 (2016).
[Non Patent Literature 2] Mohammed H. Al-Saleh et al. Composites. 42. 92-97 (2011).
[Non Patent Literature 3] Bin Shen, Wentao Zhai and Wenge Zheng, Adv. Funct. Mater. 24, 4542-4548 (2014)

SUMMARY OF INVENTION

Technical Problem

In embodiments of the present invention, an electromagnetic wave shielding film is manufactured through a solution process using a metal nanoplate.

Solution to Problem

In one embodiment of the present invention, a method of manufacturing an electromagnetic wave shielding film including an electromagnetic wave shielding layer is provided. The manufacturing method includes the steps of: preparing a metal nanoplate solution containing a solvent in which metal nanoplates are dispersed; and coating the metal nanoplate solution on a substrate.

In an exemplary embodiment, the metal nanoplate solution may include 0.01 to 80 parts by weight of the metal nanoplate with respect to 100 parts by weight of the solvent.

In an exemplary embodiment, the substrate may be coated 2 to 10 times with 1 ml of the metal nanoplate solution during the coating process.

In an exemplary embodiment, the metal nanoplate is annealed by performing a heat treatment process on the substrate coated with the metal nanoplate solution, and the heat treatment process may be performed under a temperature condition of 100 to 250° C.

In an exemplary embodiment, the metal nanoplate is annealed by performing a reduction process on the substrate coated with the metal nanoplate solution, and the reduction process may be a chemical reduction process or an optical reduction process.

In an exemplary embodiment, the electromagnetic wave shielding layer may have a thickness ranging from 50 nm to 500 μm.

In another embodiment of the present invention, another method of manufacturing an electromagnetic wave shielding film including an electromagnetic wave shielding layer is provided. The manufacturing method includes the steps of: performing a heat treatment process on a metal nanoplate; preparing a metal nanoplate solution including the heat-treated metal nanoplate, a polymer resin, and a solvent after the heat treatment process; subjecting the metal nanoplate solution to sonic treatment to produce a preliminary polymer resin-metal nanoplate composite; and drying the preliminary polymer-resin nanoplate composite to manufacture an electromagnetic wave shielding layer including the polymer resin-metal nanoplate composite.

In an exemplary embodiment, the metal nanoplate solution may include 0.01 to 80 parts by weight of the polymer resin and 0.01 to 80 parts by weight of the metal nanoplate with respect to 100 parts by weight of the solvent.

In an exemplary embodiment, the metal nanoplate is annealed through the heat treatment process, and the heat treatment process may be performed under a temperature condition of 100 to 250° C.

In an exemplary embodiment, the drying process includes a first drying process performed under a temperature condition of 15 to 30° C., and a second drying process performed under a temperature condition of 40 to 60° C.

In an exemplary embodiment, after manufacturing the electromagnetic wave shielding layer, a surface protective layer may be further formed on the electromagnetic wave shielding layer.

Advantageous Effects of Invention

According to the method of manufacturing an electromagnetic wave shielding film of the present invention, an electromagnetic wave shielding film including a metal nanoplate can be manufactured. The metal nanoplate has the same or similar physical properties as the metal material, but has a higher flatness ratio than a conductive ink material, and thus has a high electromagnetic wave shielding performance. Therefore, the electromagnetic wave shielding film manufactured to include the same may exhibit remarkably improved electromagnetic wave shielding efficiency as compared with the conventional electromagnetic wave shielding film. Accordingly, a lighter electromagnetic wave shielding film having a thickness thinner than that of the electromagnetic wave shielding film using the conventional metallic material may be manufactured.

In addition, in the method of manufacturing an electromagnetic wave shielding film of the present invention, an electromagnetic wave shielding film is manufactured through a solution process. When an electromagnetic wave shielding film is manufactured using the solution process, an electromagnetic wave shielding film may be manufactured by a simple process, so the price competitiveness of the electromagnetic wave shielding film can be improved. In addition, since the metal nanoplate used in the manufacturing method of the present invention is easily dispersed in various kinds of solvents and polymers, etc., application fields of the process can be diversified and the process efficiency can be increased.

DESCRIPTION OF EMBODIMENTS

Hereinafter, the present invention will be described in detail by way of preferred examples with reference to the accompanying drawings.

The embodiments of the present invention described in the present specification are for illustrative purposes only, and the embodiments of the present invention can be embodied in various forms and should not be construed as limited to the embodiments explained in the present specification.

It is to be understood that various modifications and many different forms may be made, and the embodiments are not intended to limit the present invention to specific forms disclosed, and that the present invention includes all modifications, equivalents, and alternatives falling within the spirit and technical scope of the present invention.

In the embodiment of the present invention, the term "metal nanoplate" means a metal material having a two-dimensional plate structure and having a diameter of 1 µm or more and a thickness of 1 nm or more.

In the embodiment of the present invention, the term "plate-shaped laminated structure" means a structure in which two-dimensional plate-shaped nanomaterials are stacked in layers, and a part of one layer in the laminated structure may be in direct contact with a part of another adjacent layer.

In the embodiment of the present invention, the term "pore" means an empty space (void) in which the periphery of a plate-shaped laminated structure is surrounded by the two-dimensional nanomaterial.

Method of Manufacturing an Electromagnetic Wave Shielding Film

Embodiments of the present invention provide an electromagnetic wave shielding film comprising an electromagnetic wave shielding layer comprising a metal nanoplate. The electromagnetic wave shielding film may be manufactured through a coating process using a metal nanoplate or a composite forming process including a metal nanoplate.

Hereinafter, a method of manufacturing a metal nanoplate through a coating process using a metal nanoplate will be described first. According to the method of manufacturing an electromagnetic wave shielding film through a coating process using a metal nanoplate, an electromagnetic wave shielding film comprising a sequentially laminated substrate, an electromagnetic wave shielding layer and a surface protective layer may be manufactured.

Figure 1:
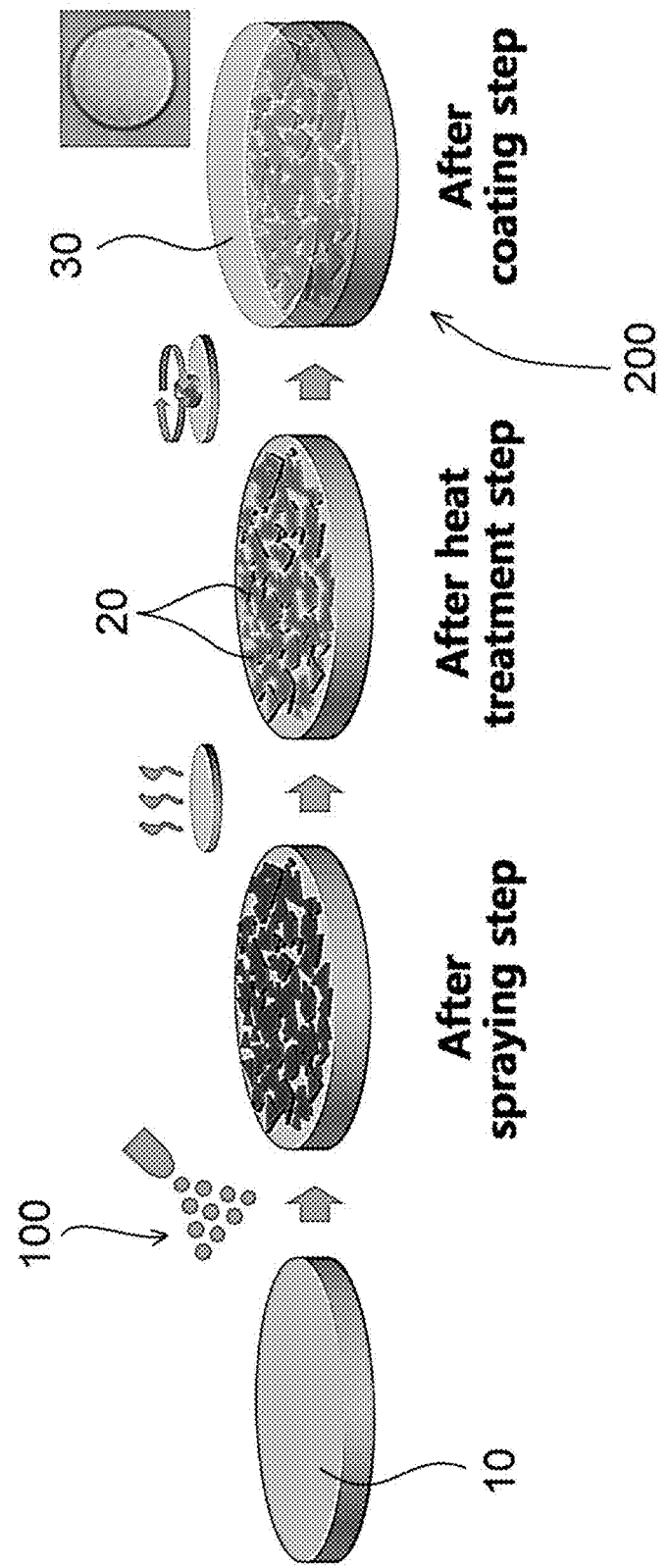
FIG. 1 is a schematic view schematically showing steps of manufacturing a shielding film manufactured according to Examples 1 to 11.

FIG. 1 schematically shows a method of manufacturing an electromagnetic wave shielding film (200) through a coating process (spray process) of applying metal nanoparticles (100) onto a substrate (10) to form a metal nanoplate (20). Hereinafter, the manufacturing method will be described in detail with reference to FIG. 1.

First, a metal nanoplate solution containing a solvent in which a metal nanoplate is dispersed is prepared.

In an exemplary embodiment, the metal nanoplate is not limited as long as it is a metal material having a two-dimensional plate structure, and may include a noble metal such as copper, silver, platinum, gold, and the like, or a transition metal.

In an exemplary embodiment, the metal nanoplate may have a diameter in the range of 2 µm or more. For example, it may have a diameter in the range of 2 to 99 µm. As the diameter of the metal nanoplate increases, it is possible to have a better shielding effect. However, if the metal nanoplate is excessively large, the flatness ratio of the metal plate may be lowered and the advantage of the plate structure may disappear. Therefore, it is preferable to use a metal nanoplate having a diameter within the range of 2 to 99 µm.

Meanwhile, the metal nanoplate may be hydrothermally synthesized. Particularly, in the hydrothermal synthesis process, a metal growth agent may be used. The metal growth agent may play a supporting role such that the metal precursor can grow in the direction of the surface when growing into the metal nanoplate. Specifically, the binding energy accumulated in the surface direction on the surface of the metal plate can strongly affect the reducing environment. In an exemplary embodiment, the metal growth agent may include at least one selected from the group consisting of a fluorine compound, a chlorine compound, a bromine compound, an iodine compound, and an astatine (At) compound. Specifically, the metal growth agent may include at least one selected from the group consisting of $PbI_2$, KI, ICl, BrI, $ICl_3$, ICl, HBr and KBr.

In an exemplary embodiment, the larger the thickness of the metal nanoplate is, the better, but it is preferable to use a metal nanoplate having a thickness of 1 to 99 nm. If the thickness is out of the range, the advantage of the plate structure disappears and the electromagnetic wave shielding efficiency may be lowered.

In one embodiment, the metal nanoplate may have a thickness in the range of 1 to 1000 nm, and more specifically 10 to 500 nm. When the thickness is 500 nm or more, the non-plate-shaped metal nanoplate may be manufactured to have a particle shape rather than a two-dimensional plate structure.

In one embodiment, the metal may be a polycrystalline or single crystal metal. Meanwhile, in the case of a single crystal metal, any one having a face-centered cubic structure (FCC) may be used without limitation. Accordingly, the metal nanoplate may be a single crystal metal nanoplate or a polycrystalline metal nanoplate.

In one embodiment, the metal may include copper, silver, platinum, gold, or a transition metal. Also, for example, the metal nanoplate may be a copper nanoplate. In particular, the copper nanoplate may be oriented to a (111) crystal plane.

In an exemplary embodiment, the solvent may include at least one selected from the organic solvent group consisting of ethanol ($C_2H_6O$), methanol ($CH_3OH$), methylene chloride ($C_2H_2Cl_2$), tetrahydrofuran ($C_4H_8O$), hexane ($C_6H_{14}$), chloroform ($CHCl_3$), isopropanol ($C_3H_8O$), and the like.

In one embodiment, the solvent may be chloroform.

Meanwhile, the metal nanoplate solution may include 0.01 to 80 parts by weight of the metal nanoplate with respect to 100 parts by weight of the solvent. The metal nanoplate solution should contain 0.01 to 80 parts by weight of the metal nanoplate to be easily applicable to a coating process to be described later.

If the metal nanoparticle solution is prepared to contain less than 0.01 part by weight of metal nanoplates, the process time may be excessively increased. When it contains more than 80 parts by weight of metal nanoplates, the amount of the metal nanoplate may be unnecessarily increased and a spraying failure may occur.

Thereafter, the metal nanoplate solution is coated on the substrate.

In one embodiment, the coating may be performed by one or more of spraying, spin coating, bar coating, gravure coating, and dip coating methods, but any process capable of coating an ink form or a powder material may be used without limitation. For example, the metal nanoplate solution may be coated on the substrate through a droplet coating process using the metal nanoplate solution, for example, a spray process. In particular, when coating is carried out through a spray process, the process is simple and may be used in various solvent conditions and the like.

In one embodiment, the coating step may be coating the metal nanoplate with a loading amount of at least 0.2 $mg/cm^2$ on the substrate. For example, it may be coated with a loading amount of at least 0.3 $mg/cm^2$, at least 0.4 $mg/cm^2$, at least 0.5 $mg/cm^2$, at least 0.6 $mg/cm^2$, at least 0.7 $mg/cm^2$, at least 0.8 $mg/cm^2$, at least 0.9 $mg/cm^2$, at least 1.0 $mg/cm^2$, at least 1.4 $mg/cm^2$, at least 1.8 $mg/cm^2$, at least 2.0 $mg/cm^2$, at least 3.0 $mg/cm^2$, at least 4.0 $mg/cm^2$, at least 5.0 $mg/cm^2$, at least 6.0 $mg/cm^2$, at least 7.0 $mg/cm^2$, at least 8.0 $mg/cm^2$, at least 10 mg/cm$^2$, at least 20 mg/cm$^2$, at least 30 mg/cm$^2$, at least 40 mg/cm$^2$, at least 50 mg/cm$^2$, at least 60 mg/cm$^2$, at least 70 mg/cm$^2$, at least 80 mg/cm$^2$, or at least 90 mg/cm$^2$. For example, it may be coated with a loading amount in the range of 0.2-100 mg/cm$^2$, preferably in the range of 0.2-8.0 mg/cm$^2$. When the loading amount of the metal nanoplate is less than 0.2 mg/cm$^2$, the porosity of the plate-shaped laminated structure is low and it may not have sufficient electromagnetic wave shielding characteristics and heat dissipation characteristics. When the loading amount of the metal nanoplate is more than 100 mg/cm$^2$, the increase in the electromagnetic wave shielding effect may be inadequate compared to the loading amount.

In one embodiment, as the loading amount of the metal nanoplate increases, the metal nanoplate may be piled up in zigzags to form a plate-shaped laminated structure, and as the loading amount of the metal nanoplate increases, the pore ratio of the laminated structure may increase. In addition, as the plate-shaped laminated structure is formed, the surface of the electromagnetic wave shielding layer may be roughened and the surface gloss may be reduced accordingly.

In one embodiment, the substrate may be applied without limitation as long as it is a substrate made of a polymer material. In an exemplary embodiment, the substrate may comprise at least one selected from the group consisting of polyurethane, polyethylene, epoxy resin, polystyrene, polypropylene, polyimide, and polymethylmethacrylate.

In one embodiment, the substrate may have a thickness of 10 to 200 μm.

In an exemplary embodiment, the coating process may be performed under a condition of a room temperature and atmospheric pressure, with the substrate being applied to a temperature in the range of 50 to 80° C. For example, the coating process may be performed under a condition of a temperature of 15 to 25° C. and a pressure of about 1 atm.

In an exemplary embodiment, the metal nanoplate solution may be coated on the substrate by spraying 2 to 10 times with 1 ml of the metal nanoplate solution during the coating process. In case of less than 2 times, the shielding efficiency may drop sharply due to the thin thickness and empty space. If it is performed more than 10 times, the electromagnetic wave shielding efficiency of the electromagnetic wave shielding layer does not increase in proportion to the thickness of the electromagnetic wave shielding layer, which is not preferable when it is judged based on economic aspects or the like.

Thereafter, a heat treatment process or a reduction process is performed on the substrate coated with the metal nanoplate solution to manufacture an electromagnetic wave shielding layer. The metal nanoplate may be annealed and the solvent may be evaporated through the heat treatment process or the reduction process.

In an exemplary embodiment, a heat treatment process may be performed on a substrate coated with a metal nanoplate solution to manufacture an electromagnetic wave shielding layer, wherein the heat treatment process may be performed at a temperature ranging from 100° C. to 250° C. If the temperature is lower than 100° C., the metal nanoplate is hard to be annealed. If the temperature is higher than 250° C., the metal nanoplate may be damaged, thereby lowering the shielding efficiency of the electromagnetic wave shielding layer.

In an exemplary embodiment, the heat treatment process may be performed for 30 minutes to 1 hour.

In one embodiment, the annealing process may be performed by introducing a substrate coated with the metal nanoparticle solution into a furnace, and then heating the furnace to a specific temperature range. In this case, the shielding efficiency of the electromagnetic wave shielding film can be further increased.

Meanwhile, an electromagnetic wave shielding layer may be manufactured by performing a reduction process on a substrate coated with the metal nanoplate solution. In this case, a chemical reduction process or an optical reduction process may be performed as a reduction process. When a chemical reduction process is performed, a reducing agent such as hydrazine or NaBH4 may be used, and the optical reduction process may be performed through UV, halogen lamp, laser irradiation, or the like.

In the exemplary embodiment, the thickness of the electromagnetic wave shielding layer is preferably as thick as possible, but when the thickness range of the electromagnetic wave shielding layer exceeds a certain range, the electromagnetic wave shielding efficiency is not increased in direct proportion to the thickness of the electromagnetic wave shielding layer. So, it is preferable to have a thickness in the range of 50 nm to 500 μm. If it is more than 500 μm, it may be difficult to expect an increase in the electromagnetic wave shielding efficiency according to the increase in the thickness of the electromagnetic wave shielding layer. If the thickness is less than 50 nm, there could be a problem that the shielding efficiency may be lowered due to the thin thickness.

Subsequently, a surface protective layer is formed on the electromagnetic wave shielding layer to manufacture an electromagnetic wave shielding film. Specifically, an electromagnetic wave shielding film may be manufactured by coating a surface protective layer on the electromagnetic wave shielding layer through a spin coating process, a casting process, or the like.

In an exemplary embodiment, the surface protective layer may be used without limitation as long as it is a polymer material that does not cause metal corrosion. For example, a conductive polymer or a semiconducting polymer may be included. In an exemplary embodiment, the surface protective layer may include at least one selected from the polymer of the group consisting of epoxy resin, polyurethane, polyethylene, polystyrene, and polypropylene. The surface protective layer can improve the durability of the plate-shaped laminated structure formed.

In one embodiment, the surface protective layer may be manufactured to include SU-8, which is an epoxy resin.

In an exemplary embodiment, the surface protective layer may have a thickness in the range of 2 to 40 μm. If it exceeds 40 μm, the electromagnetic wave shielding efficiency may be lowered, and if it is less than 2 μm, it may be difficult to expect the surface protection effect of the electromagnetic wave shielding layer.

Meanwhile, an additional heat treatment process may be performed for curing after forming the surface protective layer. Specifically, a heat irradiation process and an ultraviolet irradiation process may be repeatedly performed to perform an additional heat treatment process.

Accordingly, an electromagnetic wave shielding film comprising the substrate, the electromagnetic wave shielding layer, and the surface protective layer sequentially laminated through the above-described manufacturing method may be manufactured.

According to another embodiment of the present invention, there is provided a method of manufacturing an electromagnetic wave shielding film for manufacturing an electromagnetic wave shielding film through a composite forming process comprising a metal nanoplate. According to the manufacturing method, an electromagnetic wave shielding film comprising an electromagnetic wave shielding layer may be manufactured.

Figure 2:
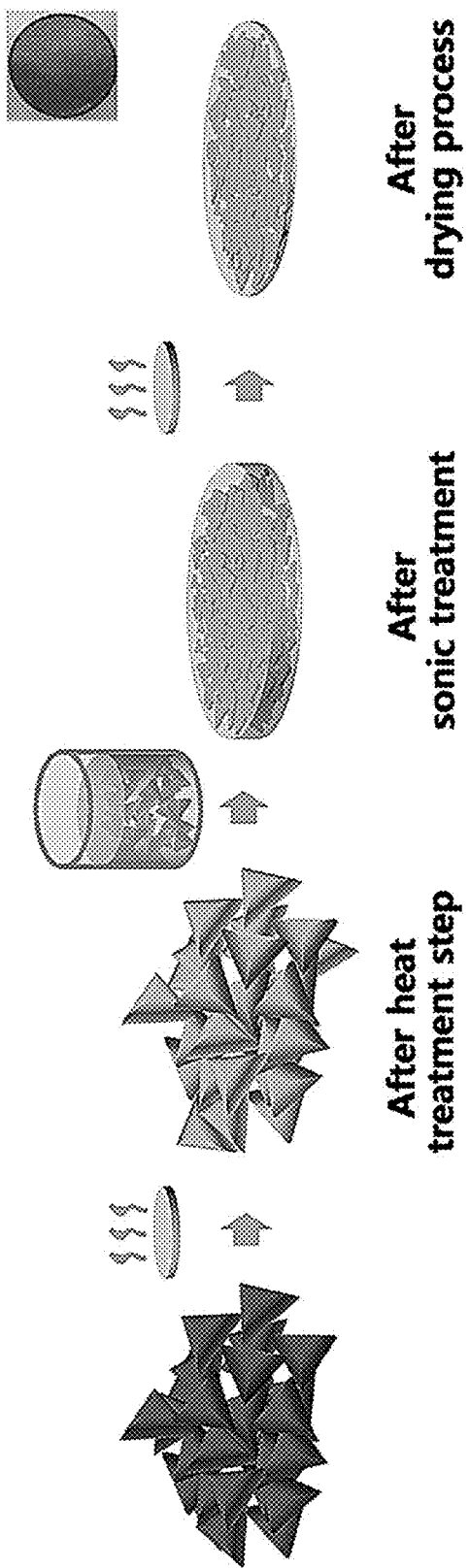
FIG. 2 is a schematic view schematically showing steps of manufacturing a shielding film manufactured according to Example 12 or 13.

FIG. 2 is a flowchart schematically showing a manufacturing step of the method of manufacturing the electromagnetic wave shielding film. Hereinafter, the manufacturing method will be described in detail with reference to FIG. 2.

First, a heat treatment process is performed on the metal nanoplate. The metal nanoplate may be annealed through the heat treatment process.

In an exemplary embodiment, the heat treatment process may be performed at a temperature of from 100 to 250° C. in a furnace for 30 minutes to 2 hours. The metal nanoplate may be annealed only under a temperature condition of exceeding 100° C. If the temperature exceeds 250° C., the metal nanoplate may be damaged, and thus there could be a problem that the shielding efficiency may be lowered.

In one embodiment, the metal nanoplate may be placed in a furnace during the heat treatment process and then heated in the furnace at a temperature in the range of 150 to 250° C.

Thereafter, a metal nanoplate solution containing the heat-treated metal nanoplate, polymer resin, and solvent is prepared.

In the exemplary embodiment, a metal material having a two-dimensional plate-shaped structure may be used as the metal nanoplate. For example, a metal nanoplate containing a noble metal material such as copper, silver, platinum, gold, or a transition metal may be used.

In an exemplary embodiment, the polymer resin may include at least one selected from the group consisting of polyurethane, polyethylene, epoxy resin, polystyrene, polypropylene, polyimide, and polymethylmethacrylate.

In one embodiment, the polymer resin may be a polystyrene.

Meanwhile, the solvent may comprise at least one selected from the organic solvent group consisting of ethanol ($C_2H_6O$), methanol ($CH_3OH$), methylene chloride ($C_2H_2Cl_2$), tetrahydrofuran ($C_4H_8O$), hexane ($C_6H_{14}$), chloroform ($CHCl_3$), isopropanol ($C_3H_8O$), and the like.

In an exemplary embodiment, the metal nanoplate solution may include from 0.1 to 80 parts by weight of the polymer resin with respect to 100 parts by weight of the solvent. When the polymer resin is contained in an amount of less than 0.1 part by weight, the formation of a composite to be described later may be difficult. When the polymer resin is contained in an amount exceeding 80 parts by weight, the shielding efficiency of the electromagnetic wave shielding layer may be lowered.

Meanwhile, the metal nanoplate solution may include 0.01 to 80 parts by weight of the metal nanoplate with respect to 100 parts by weight of the solvent. When the metal nanoplate is contained in an amount of less than 0.01 part by weight, the shielding efficiency of the electromagnetic wave shielding film may be lowered. If the metal nanoplate is contained in an amount exceeding 80 parts by weight, it may be difficult to expect an increase in efficiency of the electromagnetic wave shielding efficiency according to the introduction of the metal nanoplate.

Thereafter, the metal nanoplate solution is sonicated to produce a preliminary polymer resin-metal nanoplate composite.

In an exemplary embodiment, the sonic wave process may be performed for 10 to 30 minutes. Accordingly, a preliminary metal nanoplate composite in which a polymer resin and a metal nanoplate are bonded to each other may be prepared.

In an exemplary embodiment, the preliminary polymer-resin metal nanoplate composite may be prepared in the form of a film and may have a thickness in the range of 40 to 550 μm. If the thickness of the preliminary polymer-resin metal nanoplate composite is less than 40 μm, it is difficult to expect the improvement of the electromagnetic wave shielding efficiency. If the thickness exceeds 550 μm, it is difficult to expect an increase in the efficiency of the electromagnetic wave shielding efficiency.

Thereafter, the preliminary polymer-resin metal nanoplate composite is dried to prepare a polymer resin-metal nanoplate composite.

First, the drying process may comprise a first drying process (room temperature evaporation process) for evaporating a solvent, and the like of a metal nanoplate solution of a solution containing a polymer resin-metal nanoplate composite, and a second drying process (vacuum drying process) for more completely evaporating the solvent.

At this time, the first drying process may be performed for 1 to 20 hours under a temperature condition of 15 to 30° C. as a process of volatilizing the solvent.

Meanwhile, the second drying process is a process for more completely evaporating the solvent, and may be performed for a time ranging from 1 to 20 under a temperature condition of 40° C. to 60° C.

Thereafter, a surface protective layer may be further formed on the electromagnetic wave shielding layer. Specifically, the surface protective layer may be coated on the electromagnetic wave shielding layer through a spin coating process, a casting process, and the like to manufacture an electromagnetic wave shielding film.

In an exemplary embodiment, the surface protective layer may include at least one selected from a polymer of the group consisting of epoxy resin, polyurethane, polyethylene, polystyrene and polypropylene.

Meanwhile, an additional heat treatment process may be performed for curing after forming the surface protective layer. Specifically, a heat irradiation process and an ultraviolet irradiation process may be repeatedly performed to perform an additional heat treatment process.

According to the method of the present invention, an electromagnetic wave shielding film is manufactured through a solution process using a metal nanoplate, so an electromagnetic wave shielding film may be manufactured through a simple process. In addition, in the method of manufacturing an electromagnetic wave shielding film of the present invention, a metal nanoplate is used. Since the metal nanoplate may be dispersed in various kinds of solvents and polymers, the process efficiency can be increased.

Electromagnetic Wave Shielding Film

In one embodiment of the present invention, there is provided an electromagnetic wave shielding film comprising: a substrate; and an electromagnetic wave shielding layer coated on the substrate, wherein the electromagnetic wave shielding layer comprises a plate-shaped laminated structure in which a plurality of metal nanoplates are stacked.

In addition, in one embodiment of the present invention, there is provided an electromagnetic wave shielding film comprising an electromagnetic wave shielding layer comprising a polymer resin-metal nanoplate composite, wherein the polymer resin-metal nanoplate composite comprises the polymer resin matrix and the metal nanoplate dispersed in the polymer resin matrix.

In one embodiment, the metal of the metal nanoplate may be a polycrystalline or single crystal metal. On the one hand, in the case of a single crystal metal, it may have a face-centered cubic structure (FCC). Accordingly, the metal nanoplate may be a single crystal metal nanoplate or a polycrystalline metal nanoplate. For example, the polycrystalline metal nano-plate may be a two-dimensional metal plate-shaped material having a large difference in thickness and edge length.

In one embodiment, the plate-shaped plane of the metal nanoplate plate may have a (111) crystal plane. The adoption of such a metal nanomaterial having a (111) crystal plane in the shielding film corresponds to a configuration which is not used in the conventional electromagnetic wave shielding film.

Figure 16A:
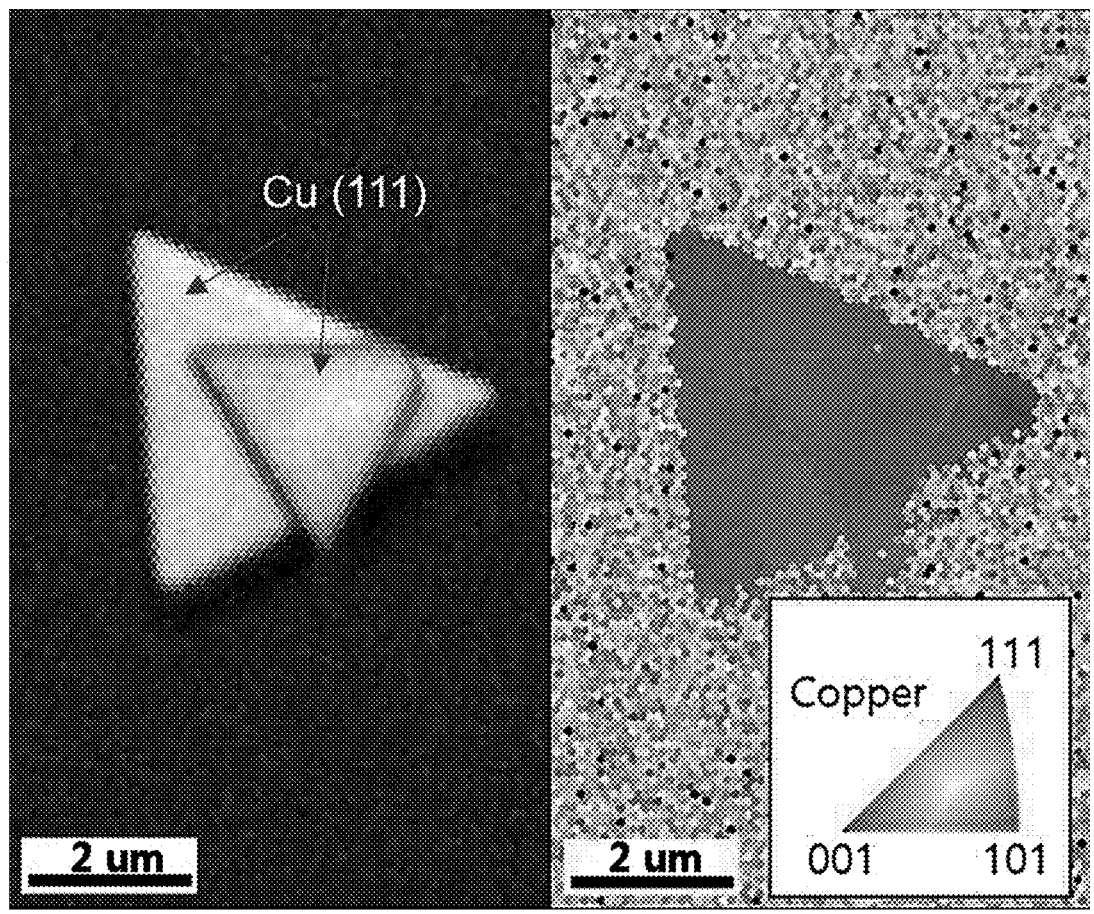
FIGS. 16A and 16B illustrate the results of backscattering electron diffraction analysis of the copper nanoplate included in the embodiment of the present invention.
Figure 16B:
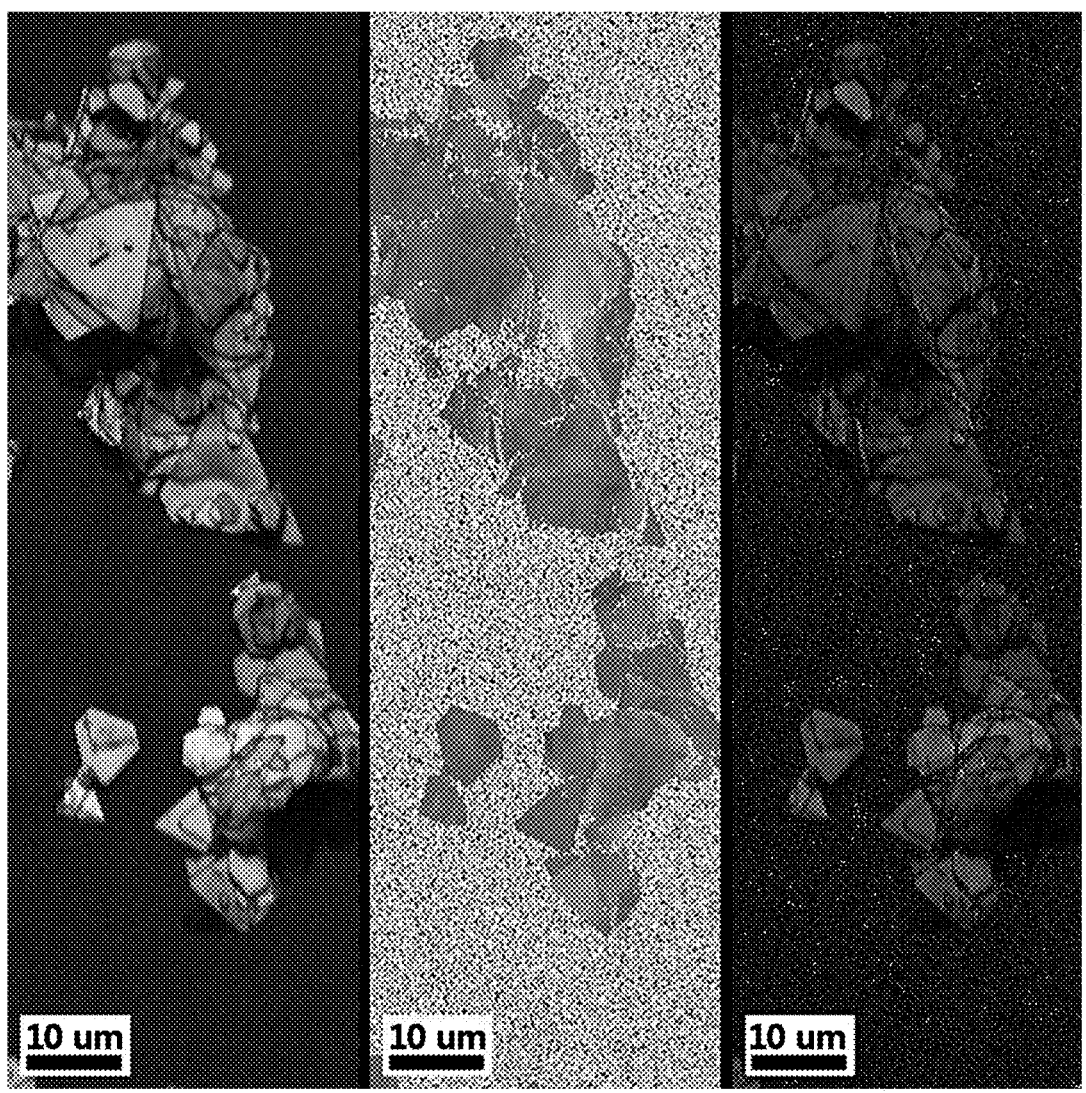

FIG. 16A shows the result of backscattering electron diffraction analysis of the copper nanoplate, wherein the entire copper nanoplate is shown in blue. From this, it was confirmed that the copper nanoplate used in one embodiment of the present invention has a single crystal of (111) plane. In FIG. 16B, it was confirmed that all of the plurality of copper nanoplates have single crystals of (111) planes.

In one embodiment, the metal may include copper, silver, platinum, gold, or a transition metal.

The electromagnetic wave shielding layer may comprise a plate-shaped laminated structure in which a plurality of metal nanoplates are stacked, and through this structure, unique electromagnetic wave shielding characteristics and/or heat dissipation characteristics may be exhibited.

Figure 18:
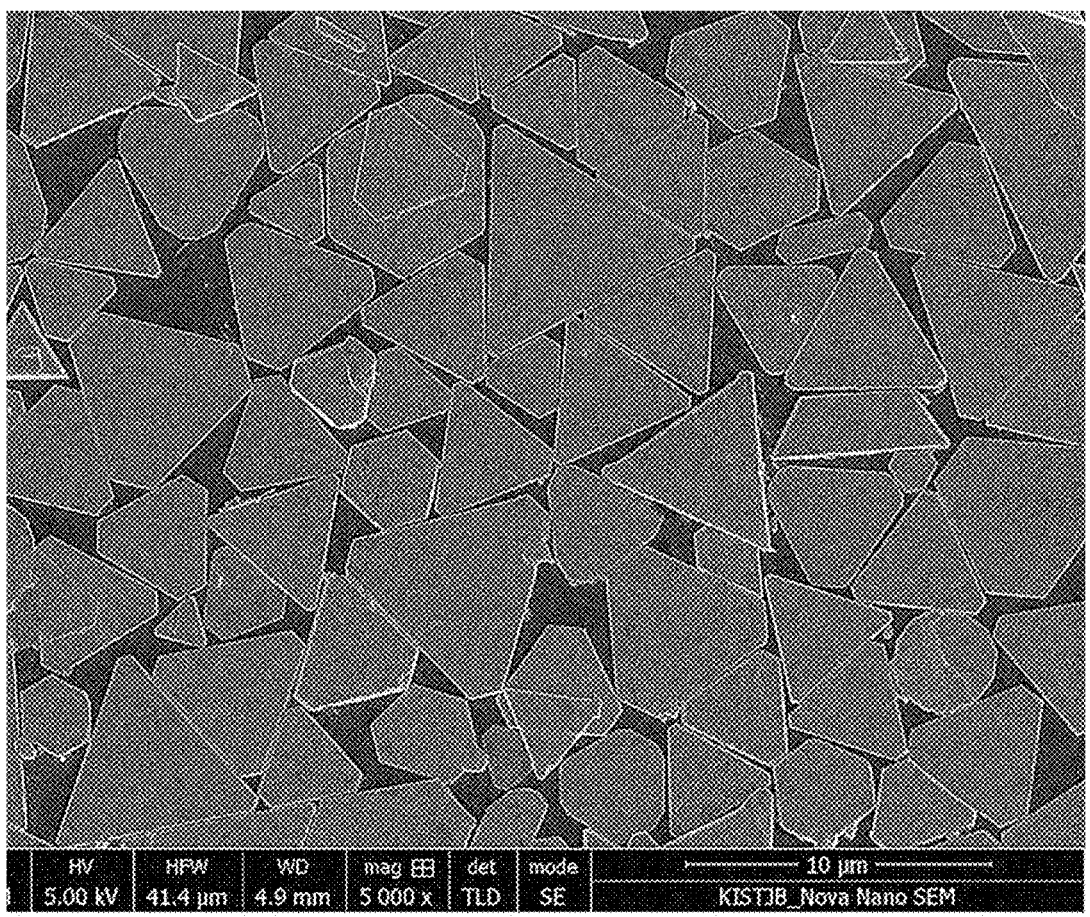
FIG. 18 is an SEM photograph showing the coverage of a metal nanoplate stacked in the electromagnetic wave shielding film according to the present invention.

FIG. 18 is an SEM photograph showing the coverage of a metal nanoplate stacked in the electromagnetic wave shielding film according to the present invention. Referring to FIG. 18, it was confirmed that the plate-shaped metal nanoplates are arranged in a plane. In addition, the space between the metal nanoplates may be formed as pores in the plate-shaped laminated structure.

In one embodiment, the plate-shaped laminated structure may comprise pores, and the pores may be formed by stacking one or more metal nanoparticles staggered with one another. Such pores correspond to structures that cannot be obtained by adopting other types of nanomaterials such as nanowires, nanoparticles, and the like. Specifically, the metal nanoplate may be in surface contact with other metal nanoplates in the periphery, and thus may have different electric conduction characteristics from nanowires or nanoparticles that are in line contact or point contact. Accordingly, the plate-shaped laminated structure according to the embodiment of the present invention can have excellent electric conductivity.

Figure 19A:
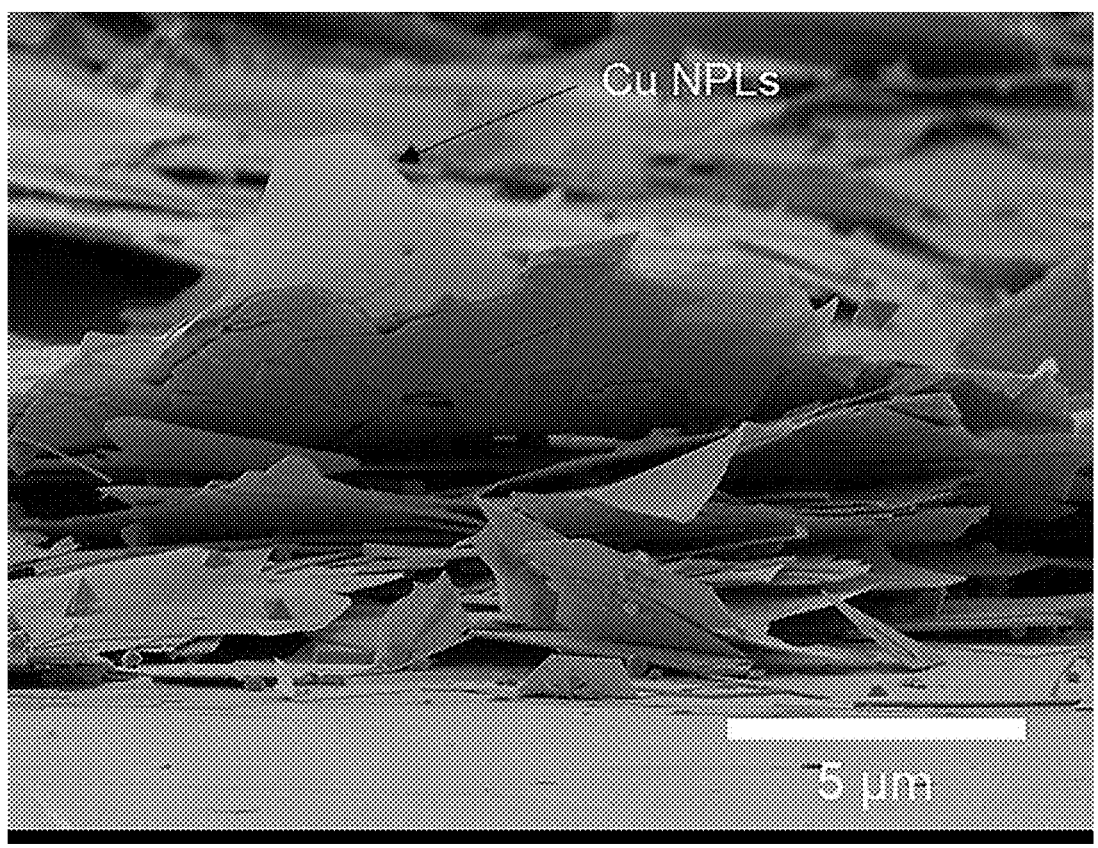
FIGS. 19A and 19B are SEM photographs showing a plate-shaped laminated structure of a copper nanoplate formed on a PI film in the electromagnetic wave shielding film according to the present invention.
Figure 19B:
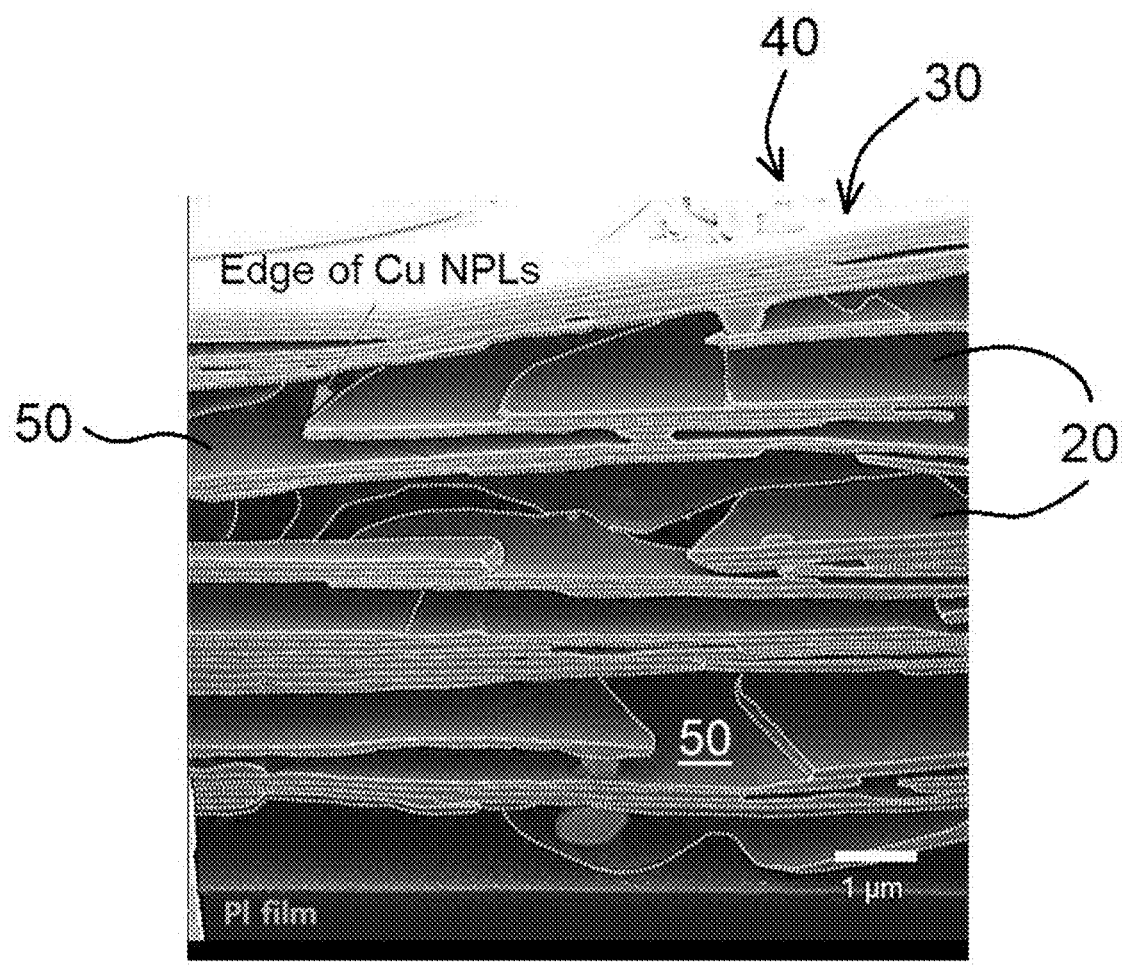

FIG. 19A illustrates a plate-shaped laminated structure (40) in which metal nanoplates (20) arranged in a plate shape of FIG. 18 are stacked, and the laminated structure (40), in which a plurality of metal nanoplates (20) are entangled and stacked, was confirmed. The plate-shaped laminated structure (40) thus formed was confirmed in more detail in the cross-sectional view of FIG. 19B. Referring to FIG. 19B, it was confirmed that the metal nanoplates (20) are staggered and stacked with one another to form a plurality of pores (50). The plate-shaped laminated structure thus formed contains a large amount of pores (50), which allows multiple reflection of electromagnetic waves to be effectively generated, thereby maximizing the electromagnetic wave shielding performance. Accordingly, the plate-shaped laminated structure according to the embodiment of the present invention can have an excellent electromagnetic wave shielding effect due to the unique structure when the same amount of metal nanoplate loading amount is provided.

In one embodiment, the electromagnetic wave shielding layer comprises a plurality of domains having a plate-shaped laminated structure, and the domains of adjacent plate-shaped laminated structures may be oriented not parallel to each other to form a pore between the domains of the plate-shaped laminated structure.

In one embodiment, the electromagnetic wave shielding layer comprises a plurality of plate-shaped laminated structures, and may form a pore between adjacent plate-shaped laminated structures.

Meanwhile, as the loading amount of the metal nanoplate increases, the metal nanoplate may be piled up in zigzags to form a plate-shaped laminated structure, and as the loading amount of the metal nanoplate increases, the porosity of the laminated structure may increase.

For example, the pore may vary depending on the contact structure between a plurality of domains having a plate-shaped laminated structure, and may vary depending on, for example, the loading amount of the loaded metal nanoplate. For example, the orientation angle between the domains of the plate-shaped laminated structure may vary depending on the loading amount of the metal nanoplate. The greater the angle, the larger the pore to be formed. Accordingly, multiple reflections of electromagnetic waves can be effectively generated and the electromagnetic wave shielding performance can be maximized.

In one embodiment, the plate-shaped laminated structure may have a porosity of at least 20%, for example, at least 30% porosity, at least 40% porosity, at least 50% porosity, or at least 60% porosity. When the porosity of the plate-shaped laminated structure is 20% or more, multiple reflection of electromagnetic waves can be effectively generated and excellent electromagnetic wave shielding performance can be obtained.

In one embodiment, the metal nanoplate may be stacked with a loading amount of 0.2-100 mg/cm$^2$. For example, it may be stacked with a loading amount of at least 0.3 mg/cm$^2$, at least 0.4 mg/cm$^2$, at least 0.5 mg/cm$^2$, at least 0.6 mg/cm$^2$, at least 0.7 mg/cm$^2$, at least 0.8 mg/cm$^2$, at least 0.9 mg/cm$^2$, at least 1.0 mg/cm$^2$, at least 1.4 mg/cm$^2$, at least 1.8 mg/cm$^2$, at least 2.0 mg/cm$^2$, at least 3.0 mg/cm$^2$, at least 4.0 mg/cm$^2$, at least 5.0 mg/cm$^2$, at least 6.0 mg/cm$^2$, at least 7.0 mg/cm$^2$, at least 8.0 mg/cm$^2$, at least 10 mg/cm$^2$, at least 20 mg/cm$^2$, at least 30 mg/cm$^2$, at least 40 mg/cm$^2$, at least 50 mg/cm$^2$, at least 60 mg/cm$^2$, at least 70 mg/cm$^2$, at least 80 mg/cm$^2$, or at least 90 mg/cm$^2$. For example, it may be stacked with a loading amount in the range of 0.2-8.0 mg/cm$^2$. When the loading amount of the metal nanoplate is less than 0.2 mg/cm$^2$, the porosity of the plate-shaped laminated structure is low and it may not have sufficient electromagnetic wave shielding characteristics and heat dissipation characteristics. When the loading amount of the metal nanoplate is more than 100 mg/cm$^2$, the increase in the electromagnetic wave shielding effect may be inadequate compared to the loading amount.

Figure 17:
FIG. 17 is an optical photograph of the surface of an electromagnetic wave shielding film manufactured by varying the loading amount of a metal nanoplate in the electromagnetic wave shielding film according to the present invention.

FIG. 17 illustrates a surface optical photograph of the manufactured electromagnetic wave shielding film when the loading amount of the metal nanoplate varies. It was confirmed that as the loading amount of the metal nanoplate increases, the surface roughness of the electromagnetic wave shielding film increases and the surface gloss decreases. In addition, as the loading amount of the metal nanoplate increases, the pore ratio of the laminated structure may increase.

Figure 20A:
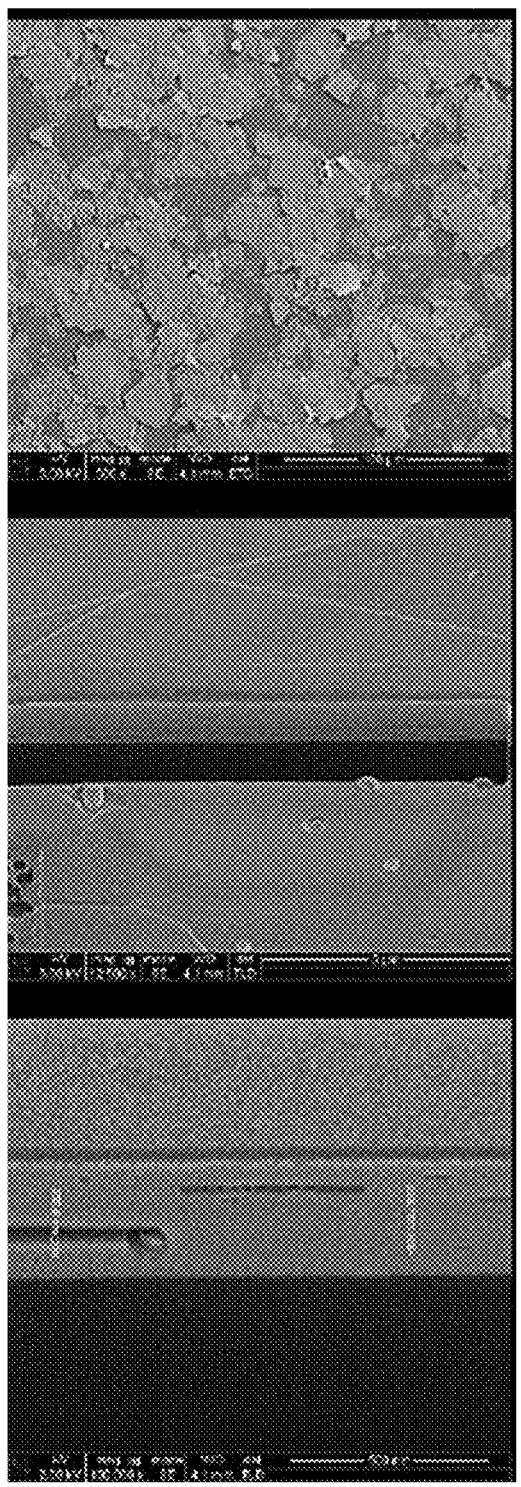
FIGS. 20A to 20G are SEM photographs showing a plate-shaped laminated structure when the loading amount of a metal nanoplate is varied in the electromagnetic wave shielding film according to the present invention.
Figure 20B:
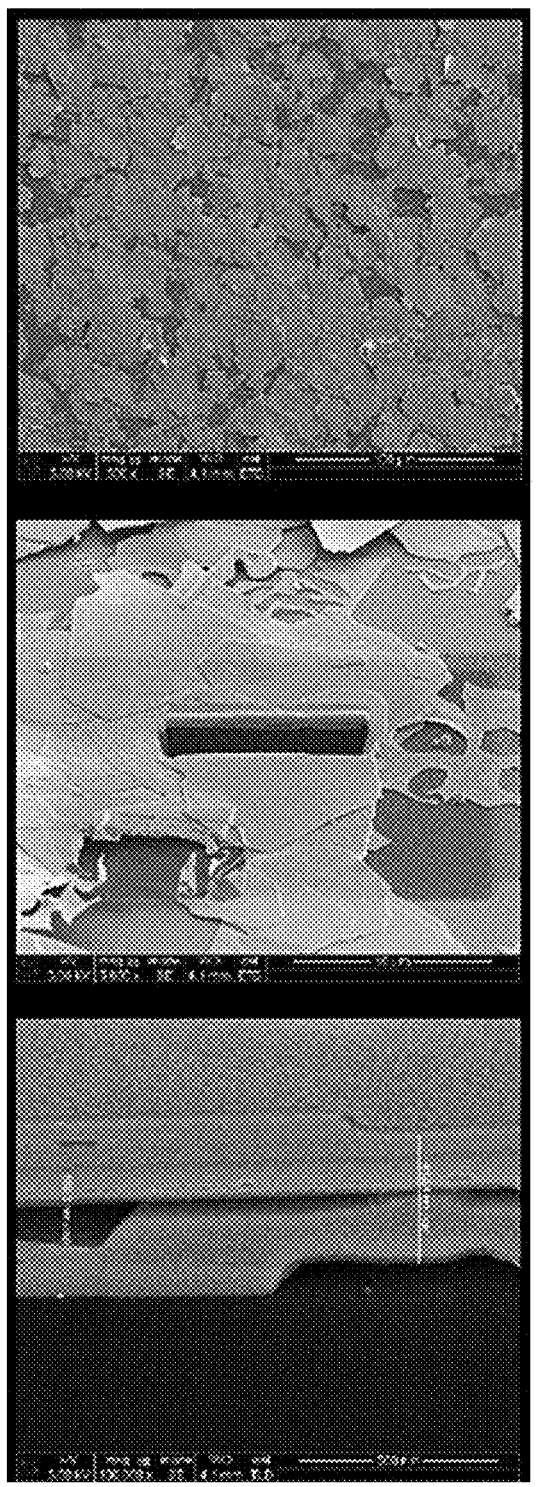
Figure 20C:
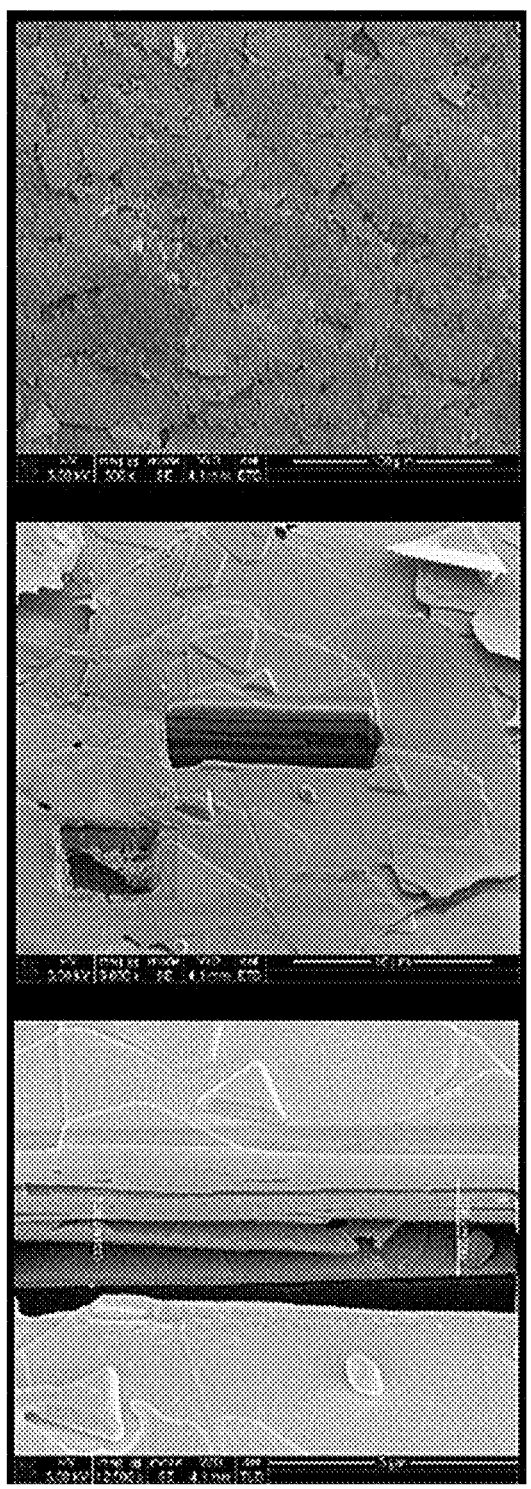
Figure 20D:
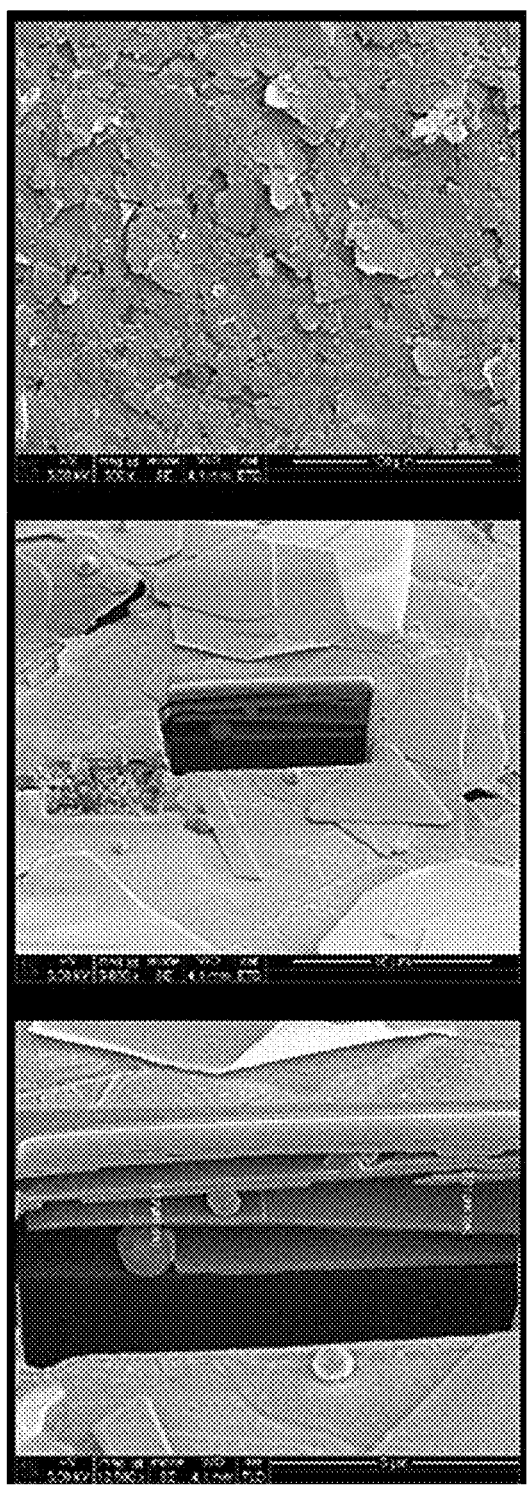
Figure 20E:
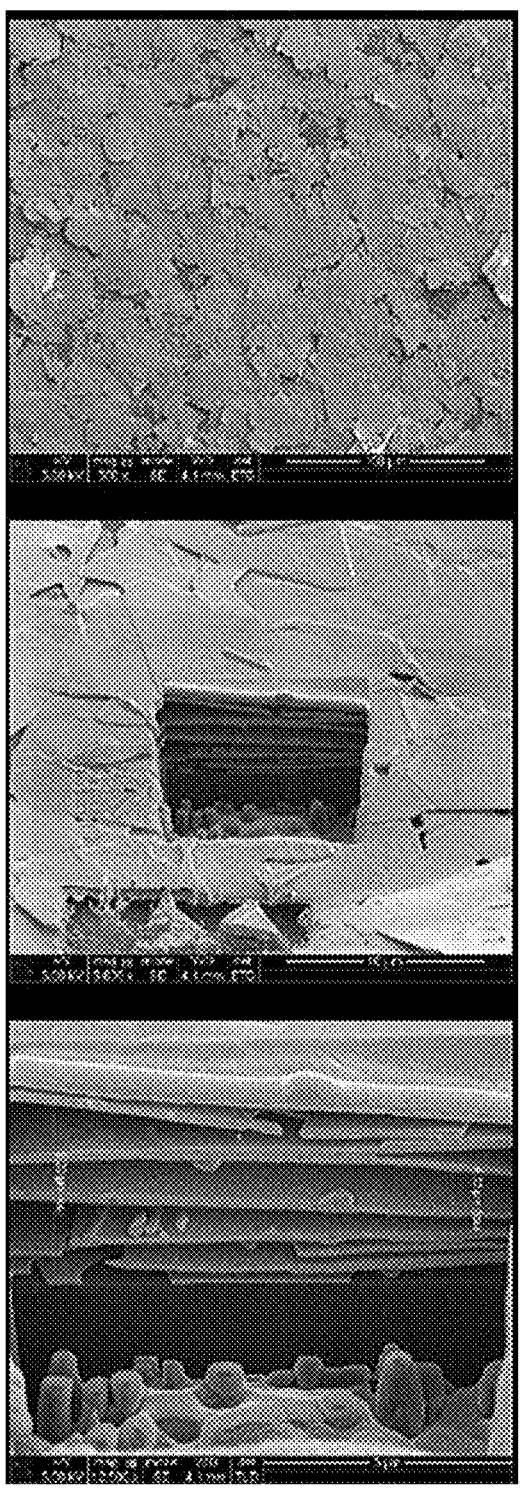
Figure 20F:
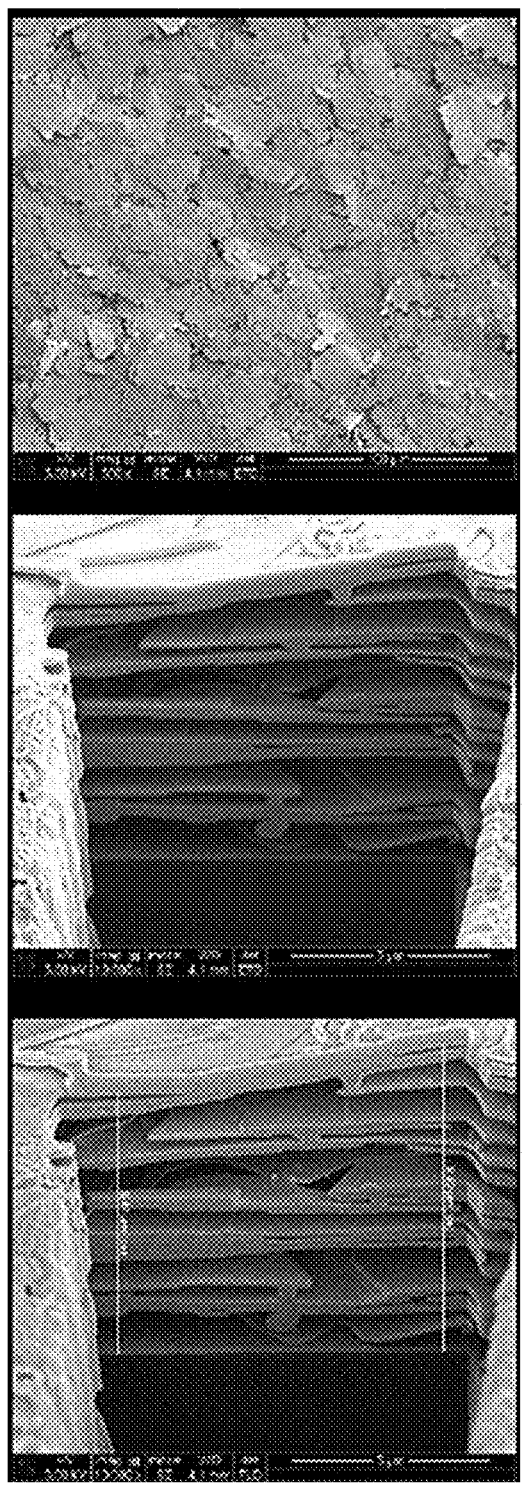
Figure 20G:
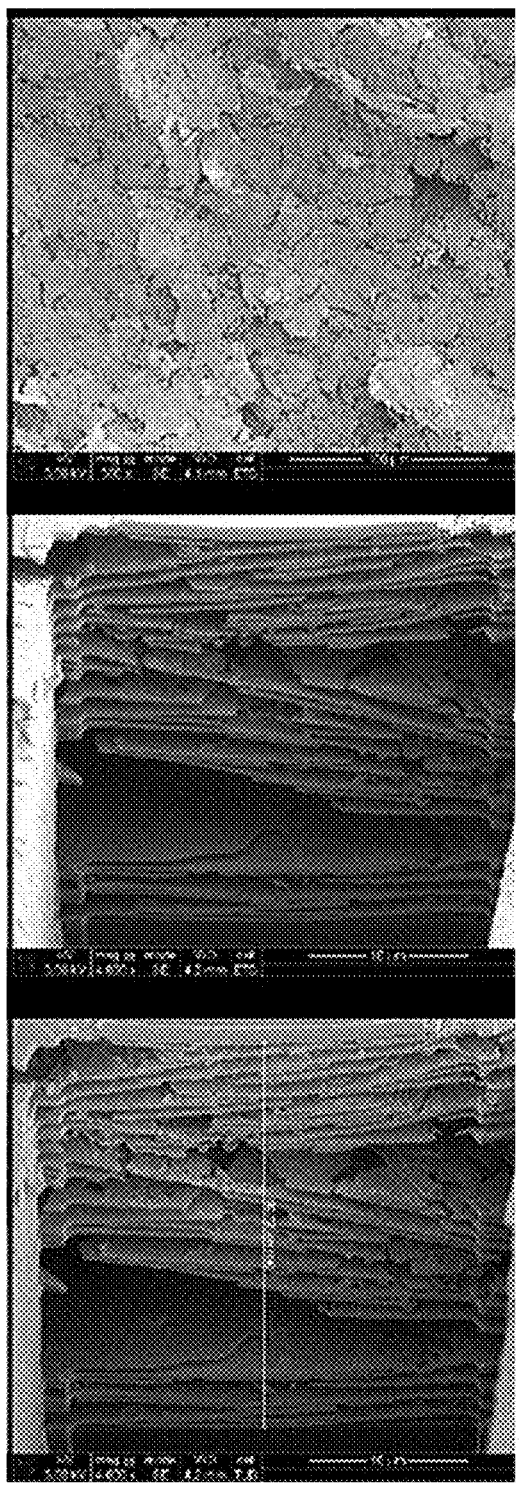
Figure 21:
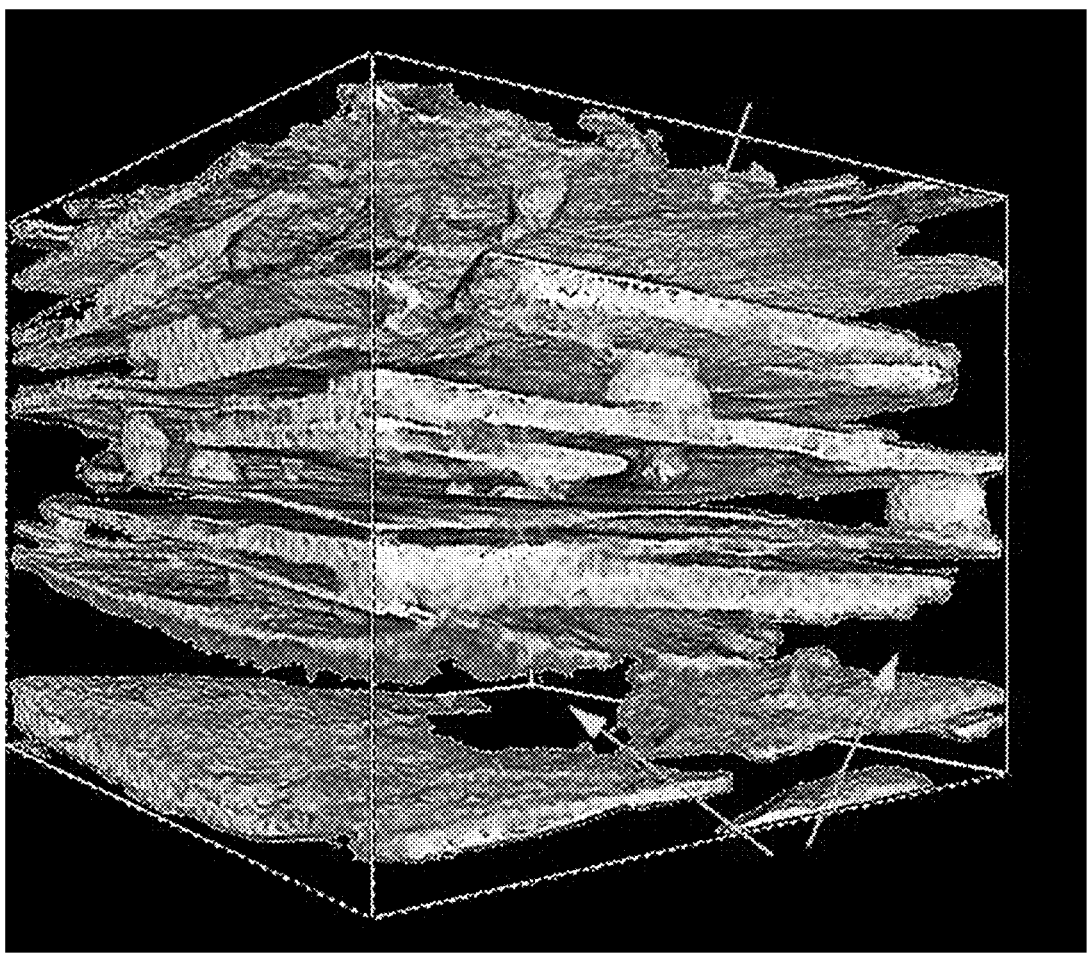
FIG. 21 is an X-ray image showing a plate-shaped laminated structure in the electromagnetic wave shielding film according to the present invention.

In one embodiment, the plate-shaped laminated structure may vary depending on the loading amount of the laminated metal nanoplate. For example, the porosity of the plate-shaped laminated structure may be varied. Specifically, referring to FIGS. 20A to 20G, when the loading amount of the metal nanoplate is 0.08 mg/cm$^2$ (FIG. 20A), it was confirmed that the metal nanoplate is stacked in the form of a plate but almost no pore is formed. This characteristic is not significantly different even when the loading amount of the metal nanoplate is 0.16 mg/cm$^2$ (FIG. 20B). The pore starts to be formed as the loading amount of the metal nanoplate goes to 0.2 mg/cm$^2$ or more, and it was confirmed that a large amount of pores are formed in the plate-shaped laminated structure as the loading amounts are increased to 0.24 mg/cm$^2$ (FIG. 20C), 0.3 mg/cm$^2$ (FIG. 20D), 0.9 mg/cm$^2$ (FIG. 20E), 1.8 mg/cm$^2$ (FIG. 20F), and 7.2 mg/cm$^2$ (FIG. 20G), respectively. In particular, when the loading amount is 7.2 mg/cm$^2$ (FIG. 20G), it was confirmed that the plate-shaped laminated structure has a domain of one or more plate-shaped laminated structures, and that the domain of the adjacent plate-shaped laminated structure is different from the domain in terms of direction where the metal nanoplate is arranged. Due to this, large pores may be formed between the domains of the plate-shaped laminated structure, and this structure can exhibit unique electromagnetic wave shielding characteristics and/or heat dissipation characteristics. Such a plate-shaped laminated structure was also confirmed through an X-ray image (FIG. 21).

In one embodiment, the metal nanoplate may be stacked with a coverage of 50% or more, such as 60% or more, 70% or more, 80% or more, 90% or more, 95% or more. In order to secure the conductivity of the electromagnetic wave shielding film, a coverage exceeding a certain level is required, and excellent conductivity can be obtained at a coverage of 50% or more.

In one embodiment, the electromagnetic wave shielding layer may have a thickness in the range of 50 nm to 500 μm, and may have a thickness in the range of, for example, 2-50 μm. If it exceeds 500 μm, it may be difficult to expect an increase in the electromagnetic wave shielding efficiency according to the increase in the thickness of the electromagnetic wave shielding layer. If it is less than 50 nm, there could be a problem that the shielding efficiency may be lowered due to the thin thickness.

In one embodiment, the substrate may be applied without limitation as long as it is a substrate made of a polymer material. In an exemplary embodiment, the substrate may include one or more selected from the group consisting of polyurethane, polyethylene, epoxy resin, polystyrene, polypropylene, polyimide, and polymethylmethacrylate.

In an exemplary embodiment, the surface protective layer may be used without limitation as long as it is a polymer material that does not cause metal corrosion. For example, a conductive polymer or a semiconducting polymer may be included. In an exemplary embodiment, the surface protective layer may include at least one selected from the polymer of the group consisting of epoxy resin, polyurethane, polyethylene, polystyrene, and polypropylene. The surface protective layer can improve the durability of the plate-shaped laminated structure formed.

In one embodiment, the electromagnetic wave shielding layer may further include metal nanoparticles or metal nanowires. When the metal nanoparticles or the metal nanowires are further included, in addition to the surface contact between the metal nanoparticles and other peripheral metal nanoparticles, line or point contact between the metal nanoparticles or the metal nanowires may be additionally applied. Accordingly, it is possible to obtain excellent electrical conductivity.

In one embodiment, the electromagnetic wave shielding film may have a heat dissipation characteristic.

Meanwhile, the metal nanoplate included in the electromagnetic wave shielding film of the present invention exhibits the same or superior electromagnetic wave shielding effect as compared with the conventional metallic material. The electromagnetic wave shielding film manufactured using the same has superior electromagnetic wave shielding efficiency in the range of 25 to 55 dB.

In addition, the electromagnetic wave shielding film may have a thin thickness and light weight as compared with the conventional electromagnetic wave shielding film. For example, it may have a weight in the range of 10 to 50 mg based on an area of 2 cm$^2$ and a thickness in the range of 4 to 550 μm. Accordingly, it can be used in various fields such as electronic products such as mobile electronic devices, which are required to be miniaturized gradually, and large electronic products.

Nano Electrode

In one embodiment, there is provided a nano electrode including an electromagnetic wave shielding film according to an embodiment of the present invention. In particular, the metal nanoplate has a high aspect ratio and can have excellent electric conductivity in the plane direction. In addition, the plate-shaped laminated structure of the electromagnetic wave shielding film may have the structure in which a metal nanoplate is in surface contact with other metal nanoplate in the periphery. This makes it possible to differentiate electric conduction characteristics from nanowires or nanoparticles that are in line or point contact. This was confirmed from '2D Single-Crystalline Copper Nanoplates as a Conductive Filler for Electronic Ink Applications, Small 2018, 14, 1703312.'

Accordingly, due to the plate-shaped laminated structure according to the embodiment of the present invention, the nano electrode can have excellent electric conductivity and allowable current value.

In one embodiment, the nano electrode is a patterned electrode, and the patterning may be formed by coating a metal nanoplate on a substrate. For example, the metal nanoplate solution may be coated on a substrate through a coating process to form a patterned electrode. Particularly, when coating is carried out through a spray process, there are advantages in that the process is simple and can be used in various solvent conditions.

In one embodiment, the nano electrode may be patterned by coating the metal nanoplate solution as a conductive ink, and the conductive ink may have excellent solution processability.

The nano electrode may comprise a configuration substantially overlapping with the above-described electromagnetic wave shielding film, and a detailed description thereof will be omitted.

In one embodiment, the nano electrode comprises an electromagnetic wave shielding layer, and the electromagnetic wave shielding layer may comprise a plate-shaped laminated structure in which a plurality of metal nanoplates are stacked.

In one embodiment, the plate-shaped laminated structure comprises pores, and the pores may be formed by stacking one or more metal nanoparticles staggered with each other. In addition, the electromagnetic wave shielding layer comprises a plurality of plate-shaped laminated structures, and may form pores between adjacent plate-shaped laminated structures.

Such pores correspond to structures that cannot be obtained by adopting other types of nanomaterials such as nanowires, nanoparticles, and the like. Specifically, the metal nanoplate may be in surface contact with other metal nanoplates in the periphery, and thus may have different electric conduction characteristics from nanowires or nanoparticles that are in line contact or point contact. Accordingly, the plate-shaped laminated structure according to the embodiment of the present invention can have excellent electrical conductivity.

Particularly, when a plate-shaped laminated structure is included, it can have a superior electrical conductivity than a pure metal electrode with the same density. Specifically, the pure copper electrode has a density of about 8.96 g/cm$^3$; but the shielding film according to the present invention having a density of about ⅓ of that of a pure copper electrode can have a far superior electrical conductivity at the same loading amount. Among the nanomaterials capable of forming such a laminated structure, they can have the best electrical conductivity values, and in particular, they can have a superior electrical conductivity than Mxene, which is a nanomaterial having the conventional laminated structure.

In one embodiment, the metal nanoplate may be stacked with a loading amount of 0.2-100 mg/cm$^2$. For example, it may be stacked with a loading amount of at least 0.3 mg/cm$^2$, at least 0.4 mg/cm$^2$, at least 0.5 mg/cm$^2$, at least 0.6 mg/cm$^2$, at least 0.7 mg/cm$^2$, at least 0.8 mg/cm$^2$, at least 0.9 mg/cm$^2$, at least 1.0 mg/cm$^2$, at least 1.4 mg/cm$^2$, at least 1.8 mg/cm$^2$, at least 2.0 mg/cm$^2$, at least 3.0 mg/cm$^2$, at least 4.0 mg/cm$^2$, at least 5.0 mg/cm$^2$, at least 6.0 mg/cm$^2$, at least 7.0 mg/cm$^2$, at least 8.0 mg/cm$^2$, at least 10 mg/cm$^2$, at least 20 mg/cm$^2$, at least 30 mg/cm$^2$, at least 40 mg/cm$^2$, at least 50 mg/cm$^2$, at least 60 mg/cm$^2$, at least 70 mg/cm$^2$, at least 80 mg/cm$^2$, or at least 90 mg/cm$^2$. For example, it may be stacked with a loading amount in the range of 0.2-8.0 mg/cm$^2$. When the loading amount of the metal nanoplate is less than 0.2 mg/cm$^2$, the porosity of the plate-shaped laminated structure is low, so it may not have sufficient electric conduction characteristics with respect to the density of the nano electrode. When the loading amount of the metal nanoplate is more than 100 mg/cm$^2$, the increase in the electrical conductivity may be inadequate with respect to the loading amount.

In one embodiment, the metal nanoplate may be stacked with a coverage of 50% or more, such as 60% or more, 70% or more, 80% or more, 90% or more, 95% or more. In order to secure the conductivity of the nano electrode, a coverage exceeding a certain level is required, and excellent conductivity can be obtained at a coverage of 50% or more.

Hereinafter, the present invention will be described in more detail with reference to the examples. It is to be understood by those having ordinary skill in the pertinent field, however, that these examples are for illustrative purposes only, and the scope of the present invention is not limited to these examples.

EXAMPLES

Comparative Example 1

Figure 3A:
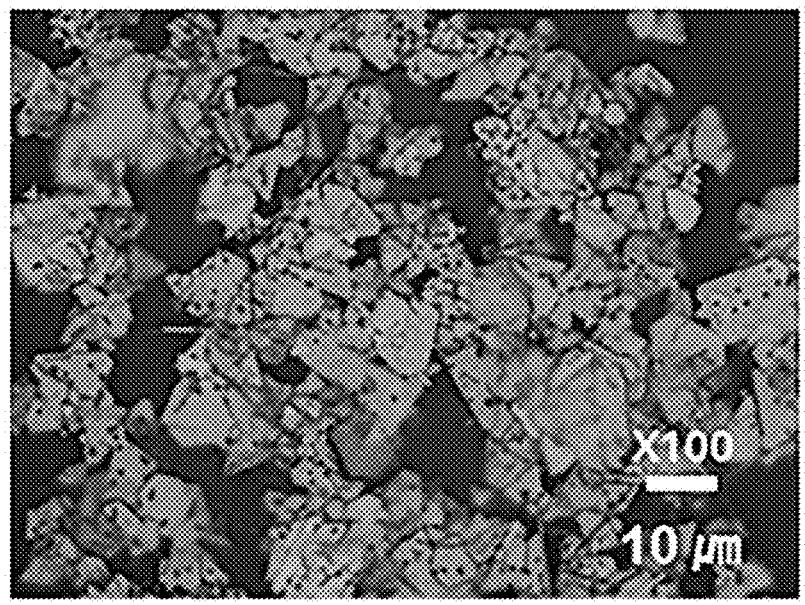
FIGS. 3A and 3B are optical micrographs of the copper nanoplate used in an embodiment of the present invention.
Figure 3B:
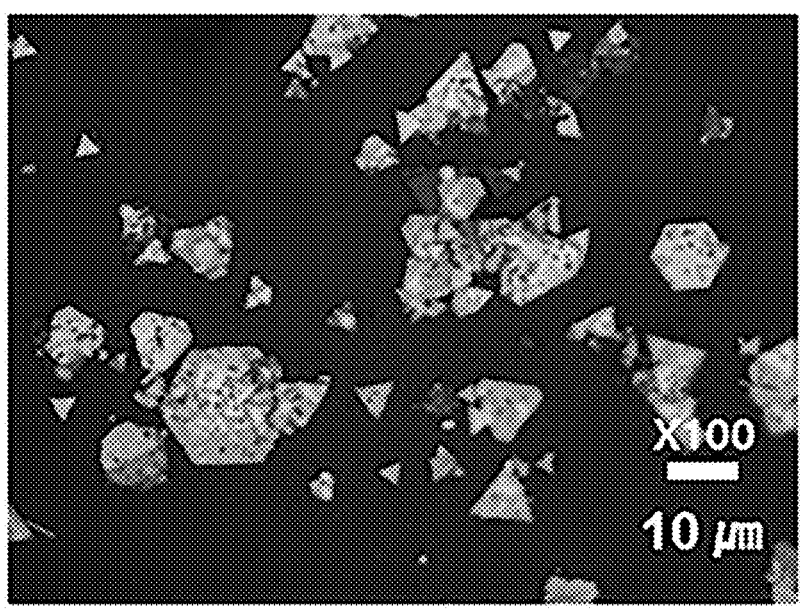
Figure 4:
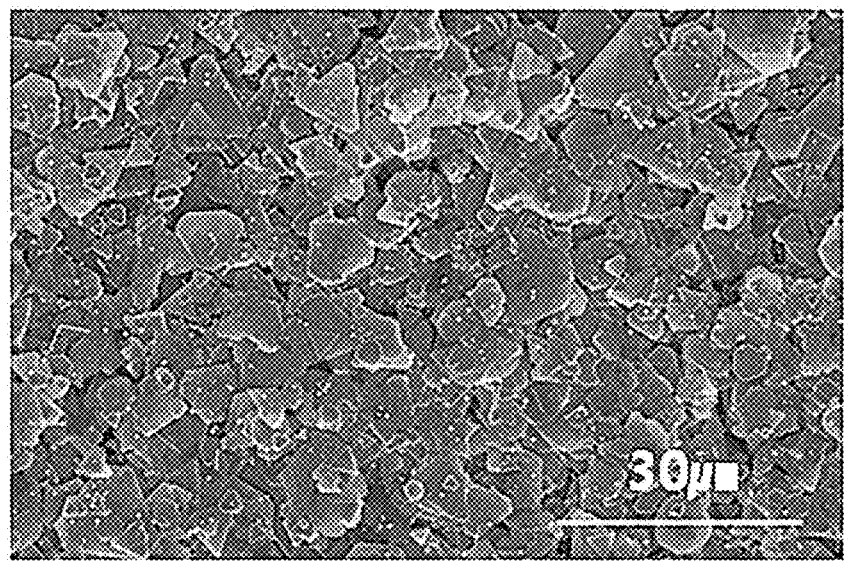
FIG. 4 is an SEM photograph of a copper nanoplate used in an embodiment of the present invention.

A mixed solution of 60 ml of chloroform in which 0.2 g of copper nanoplate (FIG. 3A to FIG. 4) was dispersed was prepared, and a polyimide film having a thickness of 100 μm was cut into a size of 2 cm×2 cm. Thereafter, the polyimide film was placed on a hot plate at 60° C., and a mixed solution in which the copper nanoplate was dispersed was spray-coated on the upper surface of the polyimide film 10 times in total by spraying 1 ml for each time to manufacture an electromagnetic wave shielding layer. Thereafter, the surface protective layer (SU-8) was coated on the electromagnetic wave shielding layer under the condition of 500 rpm/5 s-2000 rpm/30 s, followed by heat treatment for 3 minutes and 30 seconds on a 95° C. hot plate, UV treatment for 3 minutes, and heat treatment for 4 minutes and 30 seconds on a 95° C. hot plate to manufacture an electromagnetic wave shielding film including an electromagnetic wave shielding layer.

Example 1

A mixed solution of 60 ml of chloroform in which 0.2 g of copper nanoplate (FIG. 3A to FIG. 4) was dispersed was prepared, and a polyimide film having a thickness of 100 μm was cut into a size of 2 cm×2 cm. Thereafter, the polyimide film was placed on a hot plate at 60° C., and a mixed solution in which the copper nanoplate was dispersed was spray-coated on the upper surface of the polyimide film 10 times in total by spraying 1 ml for each time. And then it was subjected to a heat treatment for one hour in a furnace at 250° C. in which argon/hydrogen flowed at a ratio of 95:5 to manufacture an electromagnetic wave shielding layer. Thereafter, the surface protective layer (SU-8) was coated on the electromagnetic wave shielding layer under the condition of 500 rpm/5 s-2000 rpm/30 s, followed by heat treatment for 3 minutes and 30 seconds on a 95° C. hot plate, UV treatment for 3 minutes, and heat treatment for 4 minutes and 30 seconds on a 95° C. hot plate to manufacture an electromagnetic wave shielding film including an electromagnetic wave shielding layer.

Example 2-5

The same process as in Example 1 was carried out except that the copper nanoplate spray coating process was carried out 2 times, 4 times, 6 times, and 8 times with 1 ml per each time to manufacture the electromagnetic wave shielding film according to Examples 2 to 5 (Example 2: 2 times, Example 3: 4 times, Example 4: 6 times, Example 5: 8 times).

Example 6

The same process as in Example 3 was carried out except that a heat treatment was performed for one hour in a 200° C. furnace in which argon and hydrogen flowed at a ratio of 95:5 between the copper nanoplate spray coating and the SU-8 coating process to manufacture the electromagnetic wave shielding film.

Example 7

The same process as in Example 5 was carried out except that a heat treatment was performed for one hour in a 200° C. furnace in which argon and hydrogen flowed at a ratio of 95:5 between the copper nanoplate spray coating and the SU-8 coating process to manufacture the electromagnetic wave shielding film.

Example 8-11

The same process as in Example 1 was carried out except that a 10.6 μm-75 W laser of the UNIVERSAL LASEL SYSTEMS XLS10 MWH was used to perform an optical reduction process by a laser treatment at 7.5 W, 15 W, 22.5 W, respectively, and 30 W power and a rate of 0.025 m/s, instead of the heat treatment process in the furnace between the copper nanoplate spray coating and SU-8 coating process, to manufacture the electromagnetic wave shielding film (Example 8: 7.5 W, Example 9: 15 W, Example 10: 22.5 and Example 11: 30 W).

Example 12

The copper nanoplate was annealed through a heat treatment for one hour in a 200° C. furnace in which argon and hydrogen flowed at a ratio of 95:5. Thereafter, 0.1 g of the heat-treated copper nanoplate and 0.456 g of polystyrene were put into 45 ml of chloroform, followed by sonication for 15 minutes and mixing. The mixture was poured into a chalet having a diameter of 9 cm and evaporated at a room temperature for 12 hours to prepare a polystyrene-copper nanoplate composite. Subsequently, after 12 hours, it was vacuum-dried in a vacuum oven at 50° C. for 1 hour to manufacture a copper nanoplate shielding film containing a polystyrene-copper nanoplate composite.

Example 13

The same process as in Example 12 was carried out except that a heat treatment process was performed in a 250° C. furnace instead of a 200° C. furnace in the heat treatment to manufacture a copper nanoplate shielding film.

Examples 14 to 20

The same process as in Example 1 was carried out except that in a copper nanoplate spray coating process, the loading amount per area of copper nanoplate was 0.08 mg/cm$^2$ (Example 14), 0.16 mg/cm$^2$ (Example 15), 0.24 mg/cm$^2$ (Example 16), 0.3 mg/cm$^2$ (Example 17), 0.9 mg/cm$^2$ (Example 18), 1.8 mg/cm$^2$ (Example 19), and 7.2 mg/cm$^2$ (Example 20), respectively, to manufacture the electromagnetic wave shielding film according to Examples 14 to 20.

Experimental Example 1: Determination of Surface Characteristics

Figure 5A:
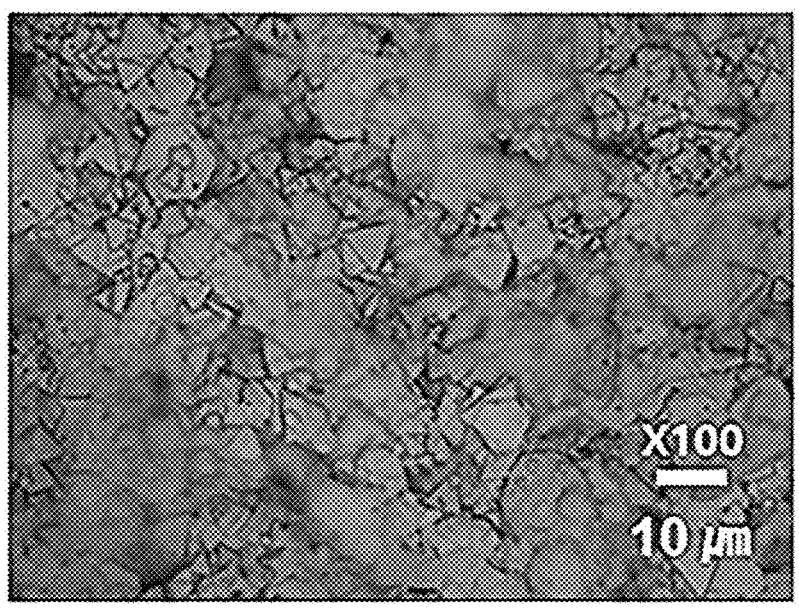
FIGS. 5A and 5B are optical micrographs of the surface of the electromagnetic wave shielding film manufactured according to Example 1.
Figure 5B:
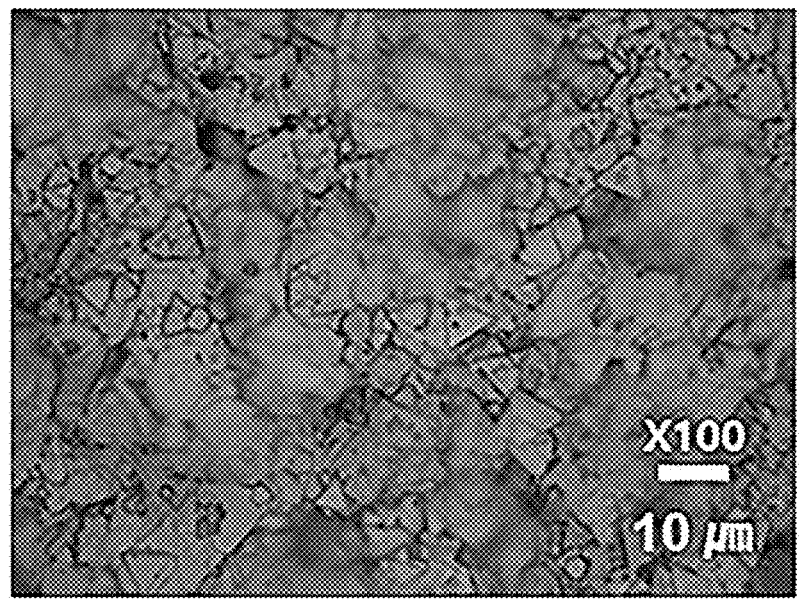
Figure 6:
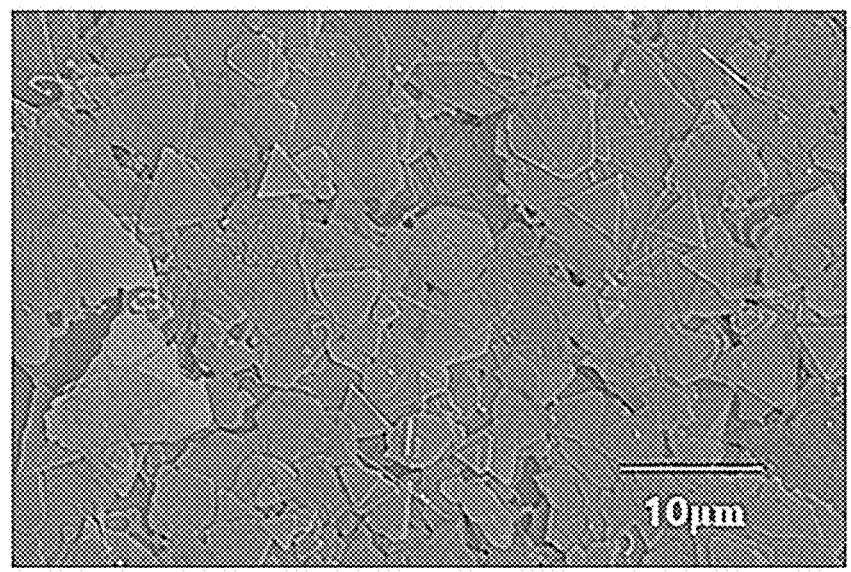
FIG. 6 is an SEM photograph of the surface of the electromagnetic wave shielding film manufactured according to Example 1.
Figure 7A:
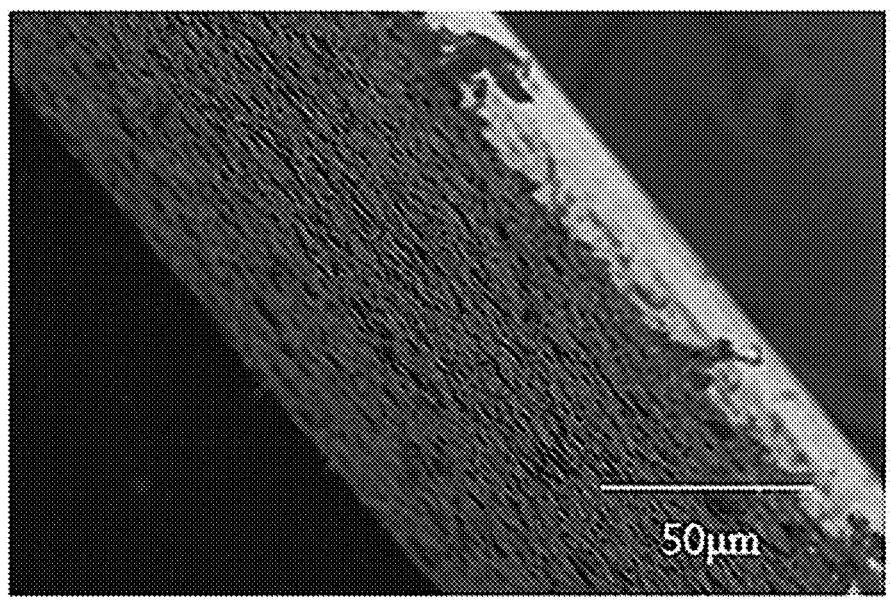
FIGS. 7A and 7B are SEM photographs of cross sections of the electromagnetic wave shielding film manufactured according to Example 1.
Figure 7B:
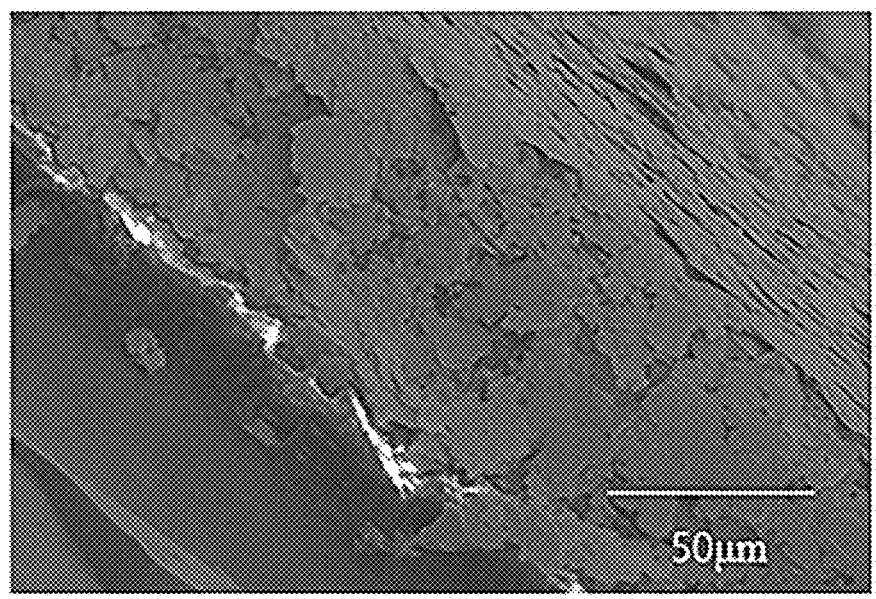

In order to analyze the surface characteristics of the electromagnetic wave shielding film manufactured according to Example 1, the surface was analyzed with an optical microscope and is shown in FIGS. 5A to 7B. FIGS. 5A and 5B are optical micrographs of the electromagnetic wave shielding film manufactured according to Example 1, and FIG. 6 is an SEM photograph thereof. FIGS. 7A and 7B are photographs of cross sections of the electromagnetic wave shielding film manufactured according to Example 1. Referring to FIGS. 5A to 7B, it was confirmed that the copper nanoplate was uniformly dispersed in the electromagnetic wave shielding film.

Figure 8A:
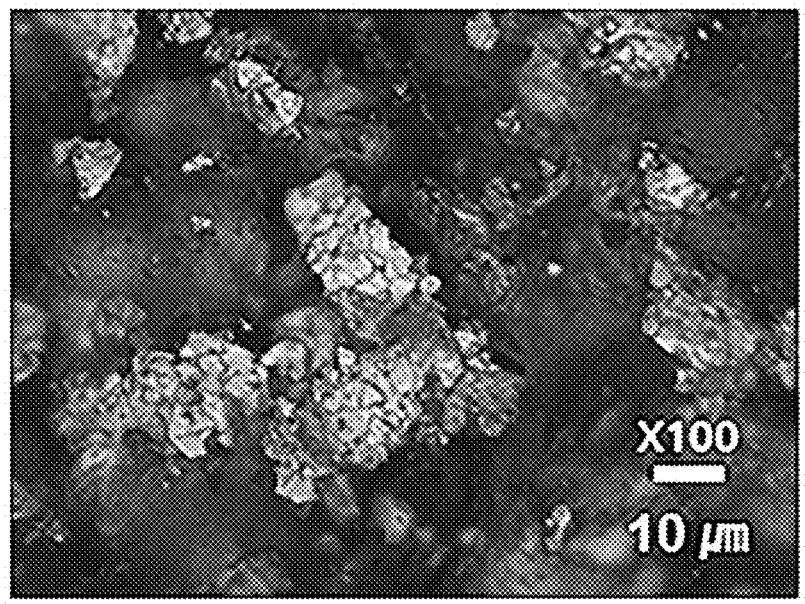
FIGS. 8A and 8B are optical micrographs of the surface of the electromagnetic wave shielding film manufactured according to Examples 12 and 13, respectively.
Figure 8B:
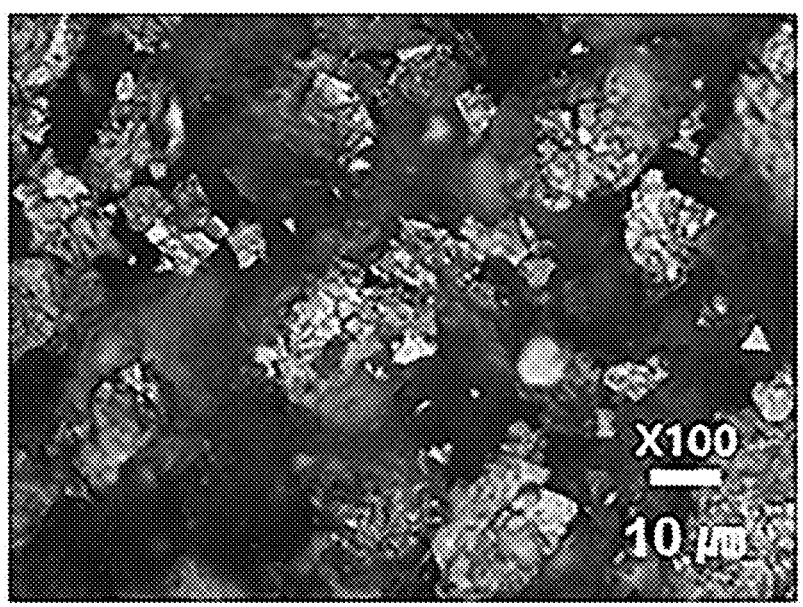
Figure 9:
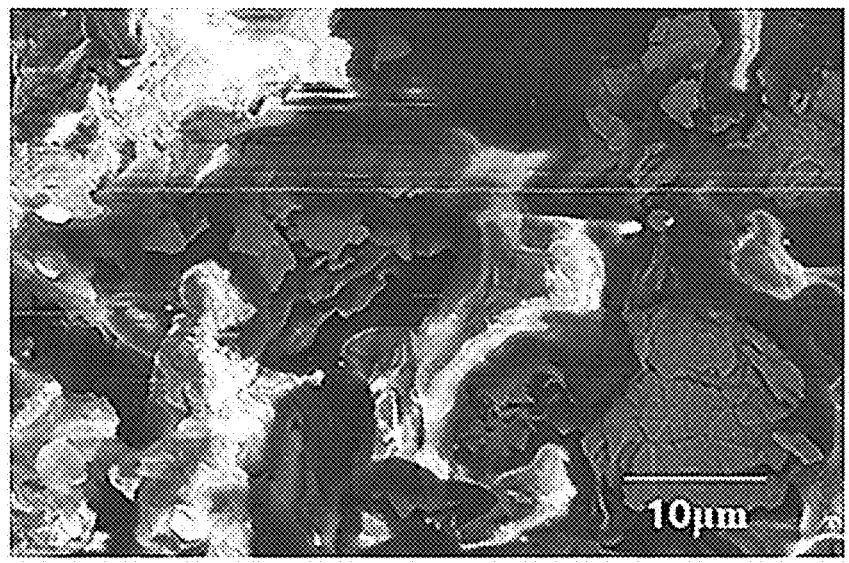
FIG. 9 is an SEM photograph of a cross section of the electromagnetic wave shielding film manufactured according to Example 12.

In addition, in order to analyze the surface characteristics of the electromagnetic wave shielding film manufactured according to Example 12, the surface was analyzed by an optical microscope and is shown in FIGS. 8A to 9. FIGS. 8A and 8B are optical micrographs of the electromagnetic wave shielding film manufactured according to Example 12, and FIG. 9 is an SEM photograph thereof. Referring to FIGS. 8A to 9, it was confirmed that even in the case of the electromagnetic wave shielding film manufactured by forming the composite of the polystyrene-copper nanoplate, the copper nanoplate was uniformly dispersed.

Experimental Example 2

1) In order to calculate the electromagnetic wave shielding efficiency of the copper nanoplate shielding film manufactured according to Comparative Example 1 and Example 1, power values (P1 and P2) according to presence or absence of an electromagnetic wave shielding film were measured using em-2108 manufactured by Electro-metrics. After the measurement, the electromagnetic wave shielding efficiency was calculated by the following equation (1).

SE(Shielding Effect)=10 log $P1/P2$     [Equation 1]

Figure 10:
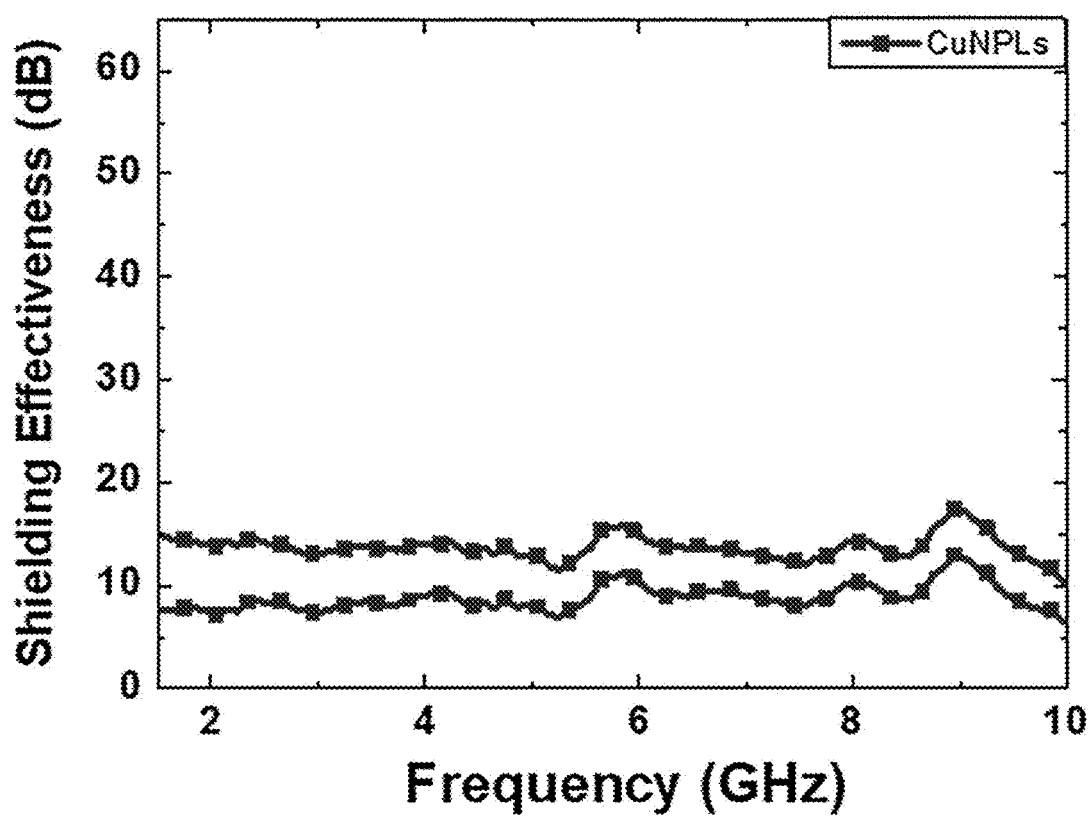
FIG. 10 is a graph showing the shielding performance of the electromagnetic wave shielding film manufactured according to Comparative Example 1.
Figure 11:
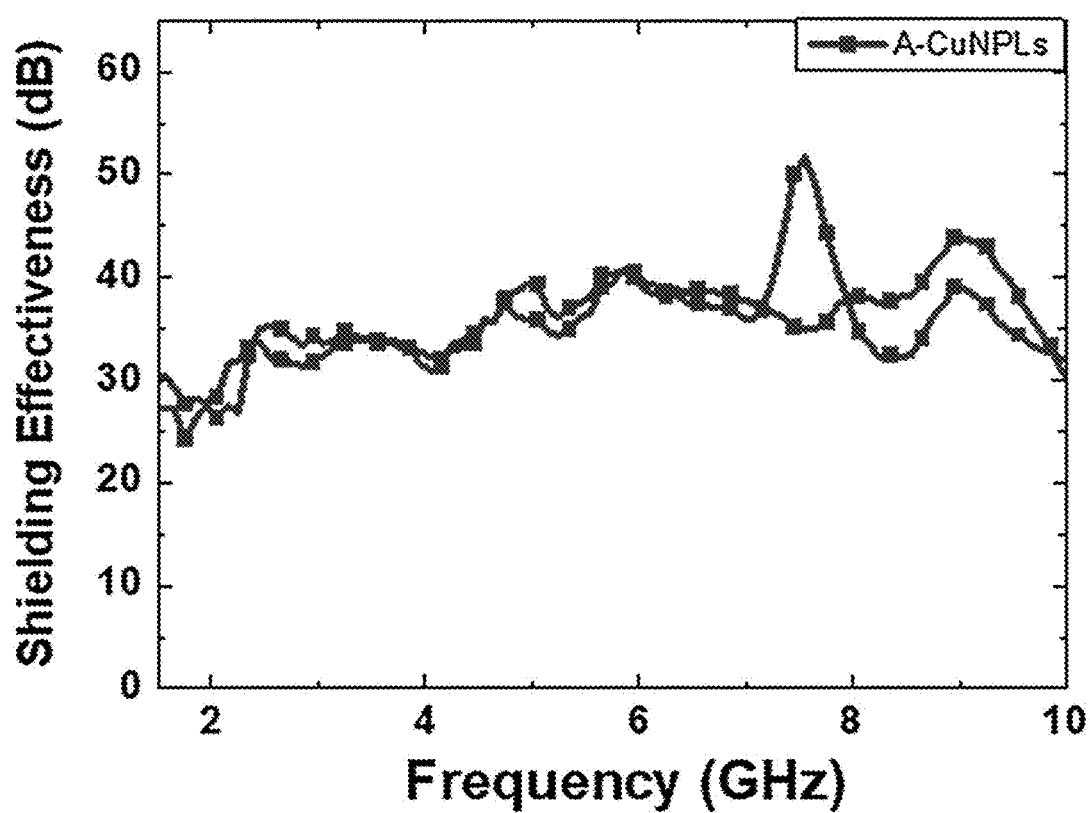
FIG. 11 is a graph showing the shielding performance of the electromagnetic wave shielding film manufactured according to Example 1.

(P1 in the equation (1) above represents the power value when the electromagnetic wave shielding film is present, and P2 represents the power value when the electromagnetic wave shielding film is not present) The results are shown in FIGS. 10 and 11, respectively (FIG. 10: Comparative Example 1 (CuNPLs), FIG. 11: Example 1 (A-CuNPLs)).

Referring to FIGS. 10 and 11, it was confirmed that the electromagnetic wave shielding efficiency was remarkably increased in the case of performing the heat treatment process (Example 1) after coating the solution containing the copper nanoplate.

Figure 12:
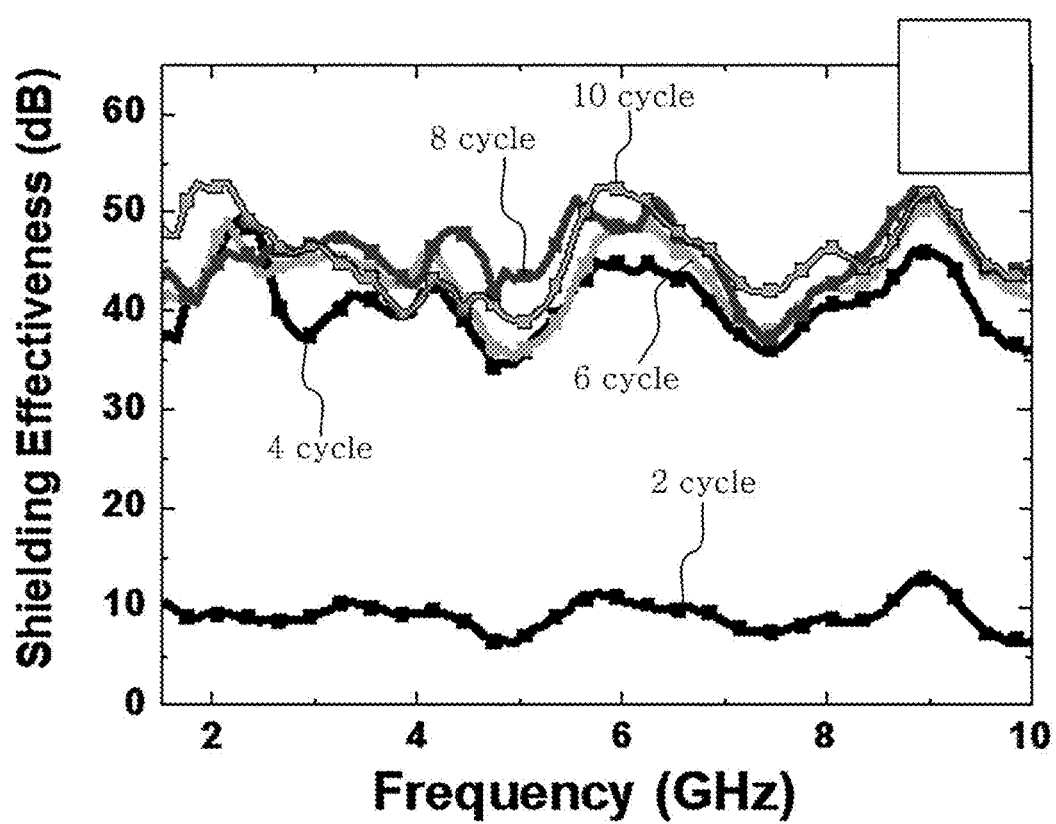
FIG. 12 is a graph showing the shielding performance of the electromagnetic wave shielding film manufactured according to Examples 2 to 5.

2) The electromagnetic wave shielding efficiency of the copper nanoplate shielding film manufactured according to Examples 2 to 5 was measured and calculated in the same manner as above, and the results are shown in FIG. 12.

Referring to FIG. 12, it was confirmed that the shielding efficiency is changed according to the number of sprayings, and that the electromagnetic wave shielding efficiency is increased as the number of spraying increases. In addition, it was confirmed that the electromagnetic wave shielding efficiency remarkably increases when the number of spraying exceeds 2 times.

Figure 13:
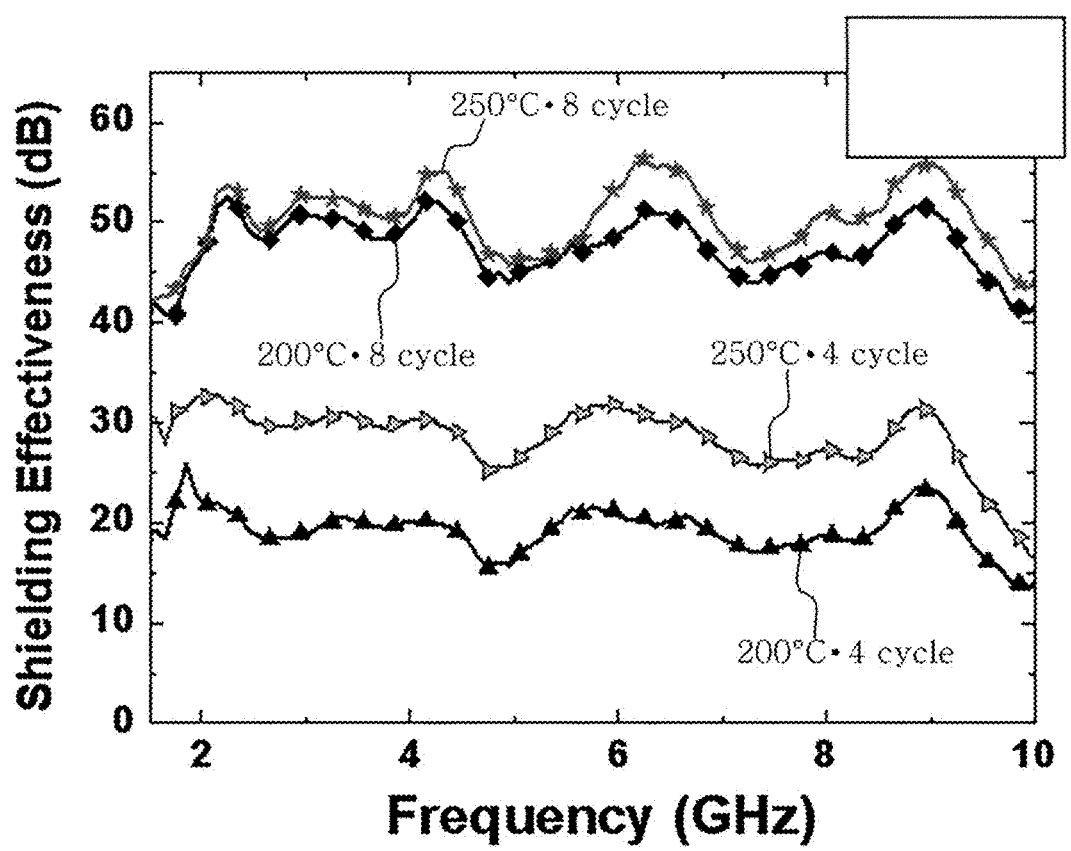
FIG. 13 is a graph showing the shielding performance of the electromagnetic wave shielding film manufactured according to Examples 3, 5, 6 and 7.

3) The electromagnetic wave shielding efficiency of the copper nanoplate shielding film manufactured according to Examples 3, 5, 6 and 7 was measured by the same method as Experimental Example 2-1, and the result is shown in FIG. 13 (Example 3: 250-4 cycle, Example 5: 250-8 cycle, Example 6: 200-4 cycle, Example 7: 200-8 cycle).

Referring to FIG. 13, it was confirmed that the shielding efficiency was changed according to the heat treatment temperature and the number of spraying, and it was confirmed that the shielding efficiency was improved as the heat treatment temperature was increased and the number of spraying was increased.

Experimental Example 3

Figure 14:
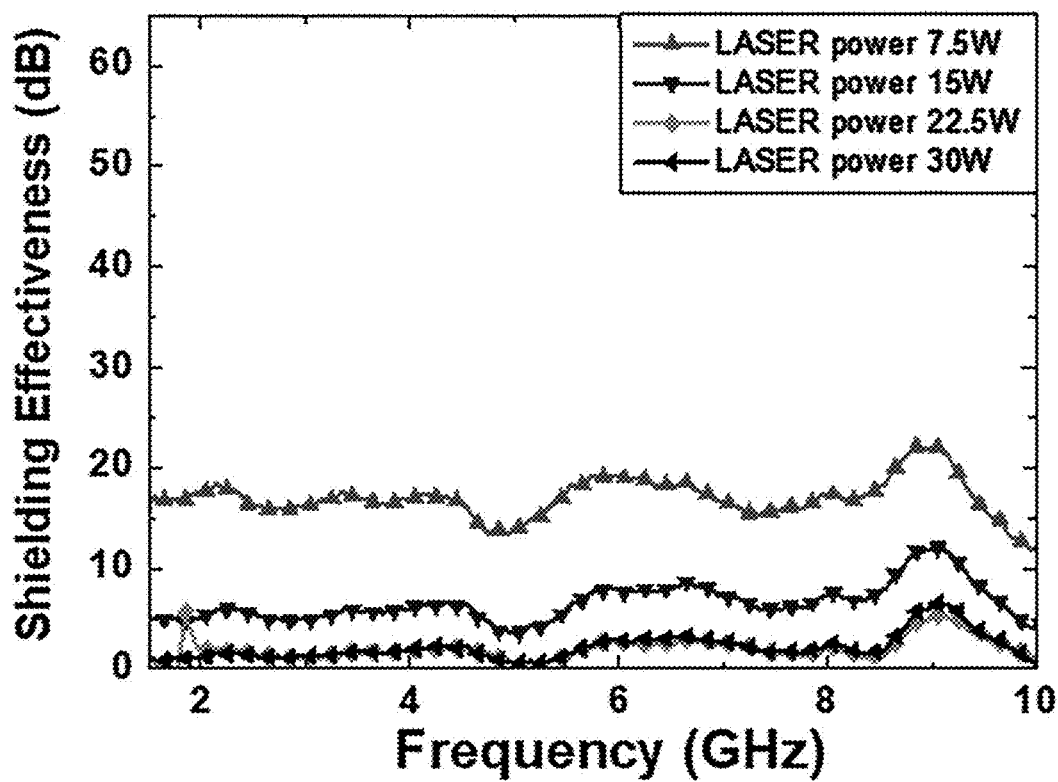
FIG. 14 is a graph showing the shielding performance of the electromagnetic wave shielding film manufactured according to Examples 8 to 11.

The electromagnetic wave shielding efficiency of the copper nanoplate shielding film manufactured according to Examples 8 to 11 was measured and calculated in the same manner as in Experimental Example 2, and the result is shown in FIG. 14.

Referring to FIG. 14, it was confirmed that the shielding efficiency was changed according to the laser power, and it was confirmed that the electromagnetic wave shielding efficiency was the best when the laser power was 7.5 W.

Experimental Example 4

Figure 15:
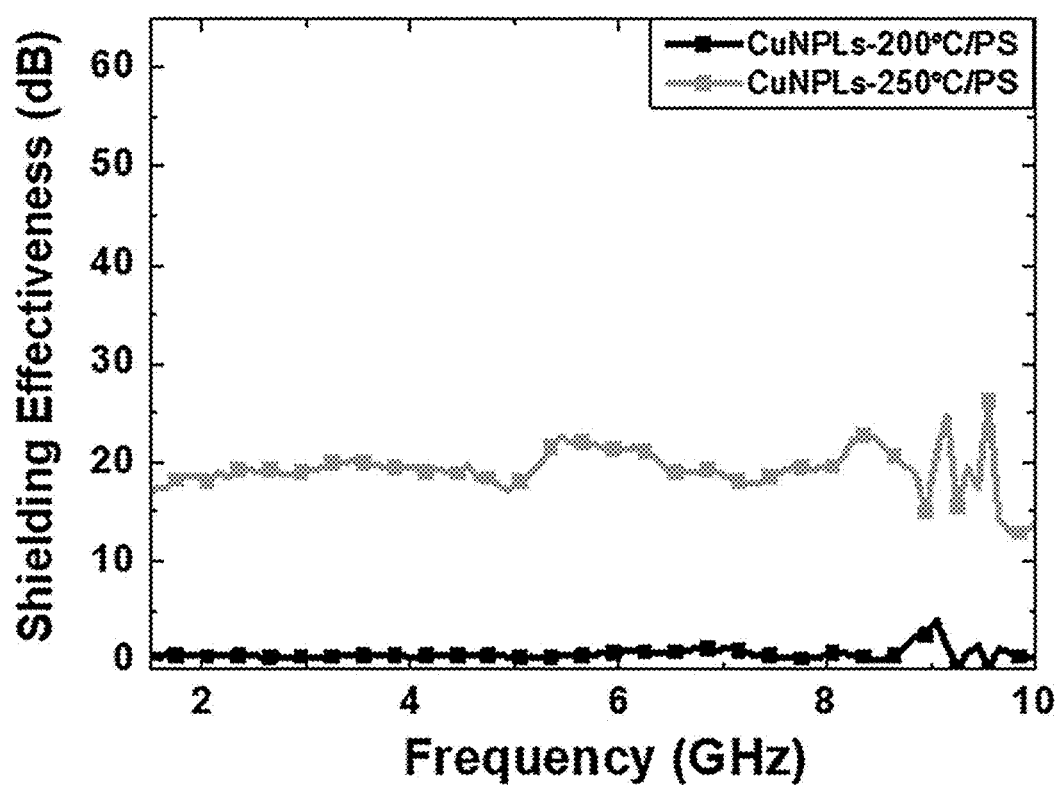
FIG. 15 is a graph showing the shielding performance of the electromagnetic wave shielding film manufactured according to Examples 12 and 13.

The electromagnetic wave shielding efficiency of the copper nanoplate shielding film manufactured according to Examples 12 and 13 was measured in the same manner as in Experimental Example 2, and the result is shown in FIG. 15 (Example 12: CuNPLs/PS200, Example 13: CuNPLs/PS250).

Referring to FIG. 15, it was confirmed that the shielding efficiency was changed according to the heat treatment temperature, and it was confirmed that the shielding efficiency was excellent when the heat treatment temperature was 250° C.

Experimental Example 5: Analysis of Electrical Characteristics According to the Loading Amount of a Metal Nanoplate The electromagnetic wave shielding efficiency of the copper nanoplate shielding film manufactured according to Examples 14 to 20 were measured and calculated in the same manner as in Experimental Example 2, and the results are shown in FIGS. 22 and 24.

Figure 22:
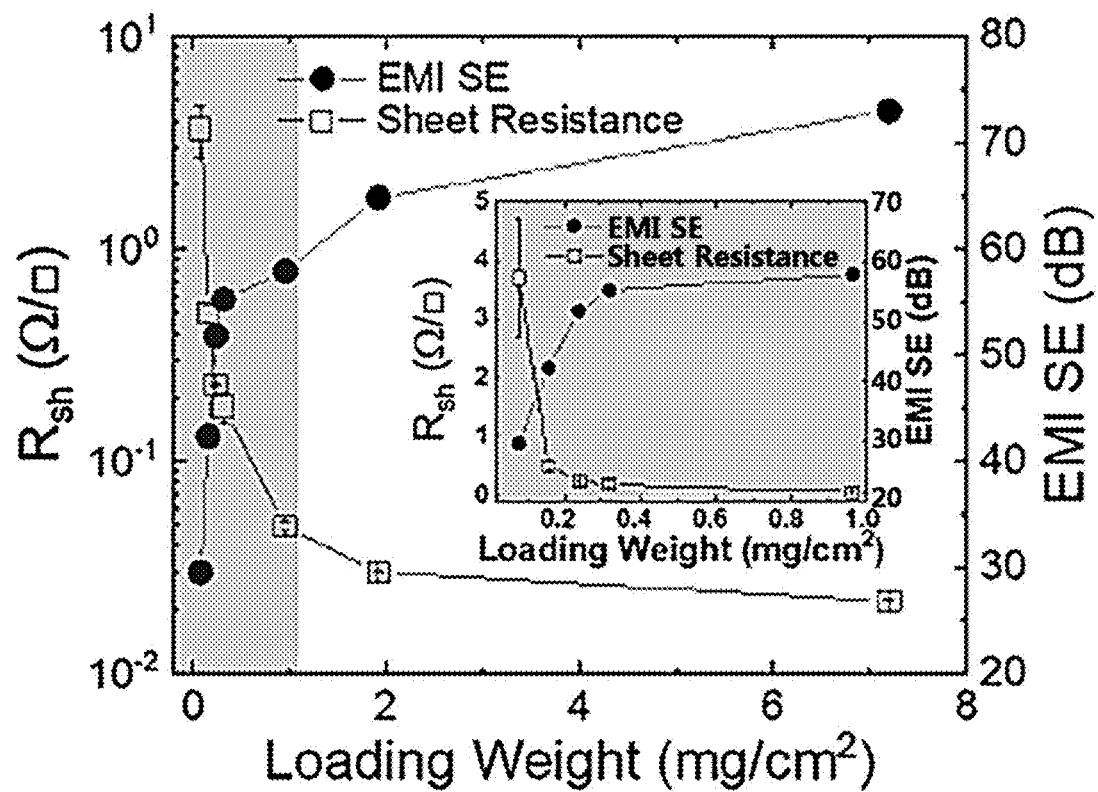
FIG. 22 is a graph showing sheet resistance and EMI SE according to the loading amount of a metal nanoplate per unit area in the electromagnetic wave shielding film according to the present invention.

Referring to FIG. 22, it was confirmed that the resistance sharply decreased and the EMI shielding effectiveness increased according to the weight of the copper nanoplate loaded per unit area ($cm^2$).

Figure 24:
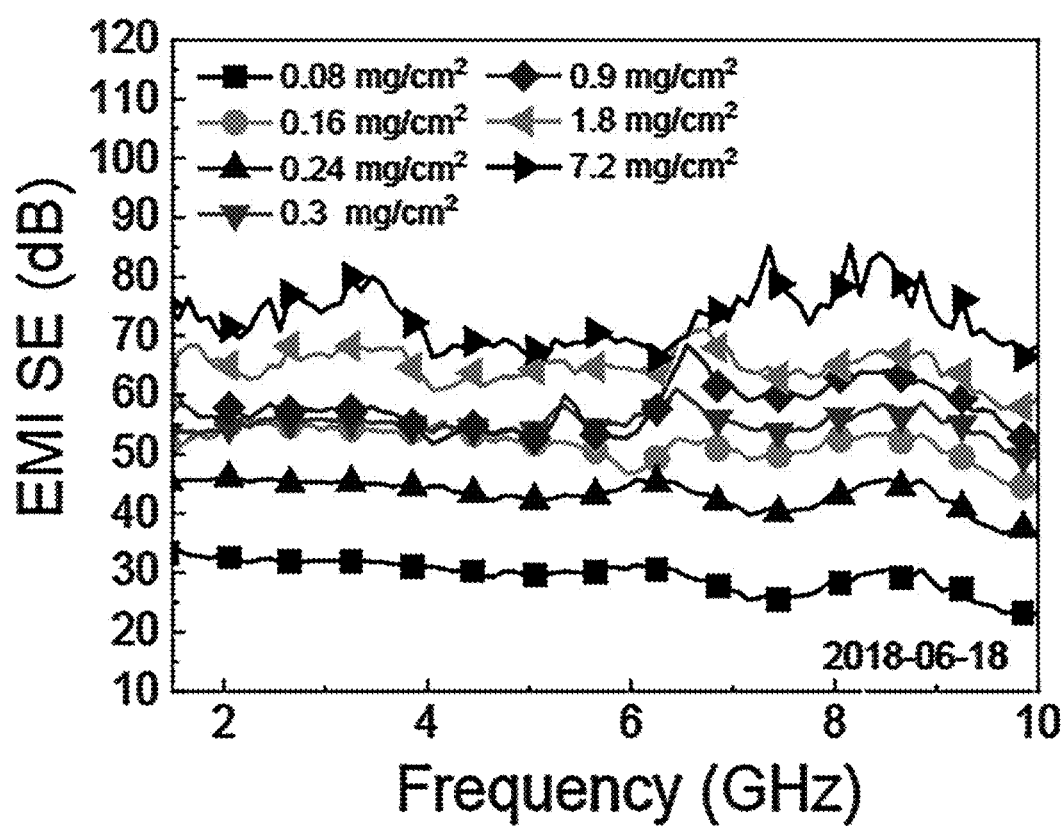
FIG. 24 is a graph showing EMI SE according to the loading amount of a metal nanoplate per unit area in the electromagnetic wave shielding film according to the present invention.

Referring to FIG. 24, it was confirmed that the electromagnetic wave shielding efficiency of the copper nanoplate shielding film manufactured according to Examples 14 to 20 was maintained even in the change of the frequency band.

Figure 23:
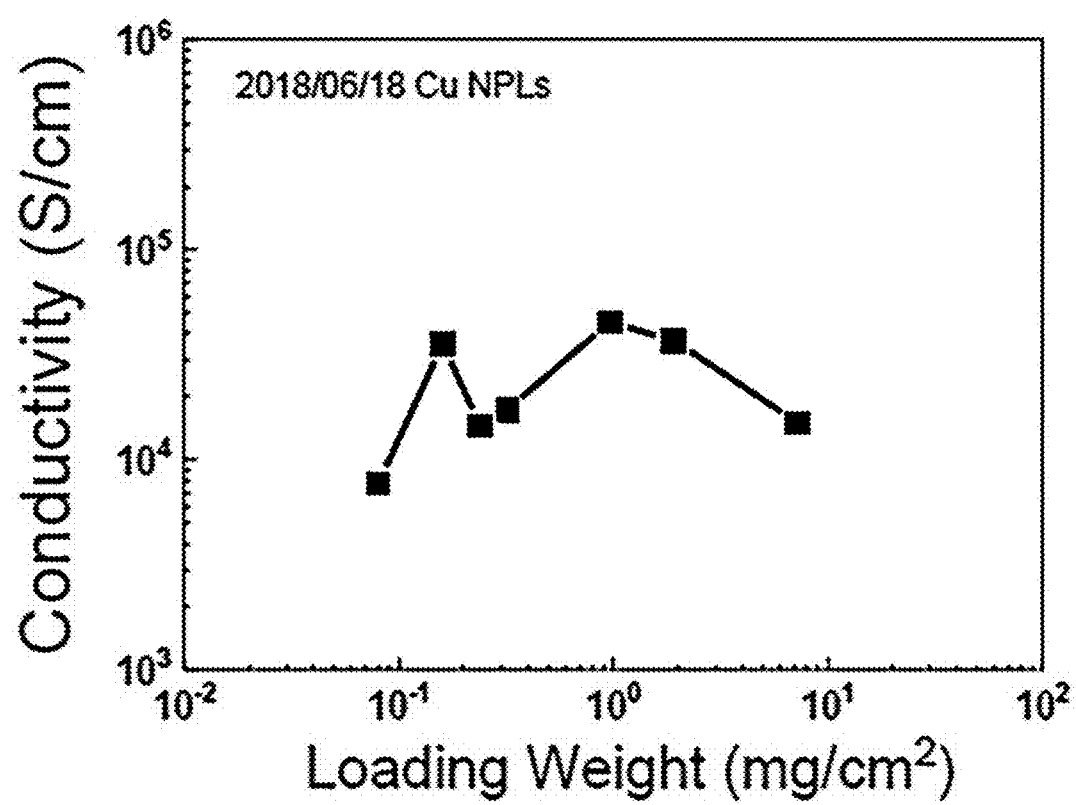
FIG. 23 is a graph showing the conductivity according to the loading amount of a metal nanoplate per unit area in the electromagnetic wave shielding film according to the present invention.

In addition, the electrical conductivity of the copper nanoplate shielding film manufactured according to Examples 14 to 20 was measured, and the result is shown in FIG. 23.

Referring to FIG. 23, it was confirmed that the embodiments have a relatively lower value in conductivity (copper: $5.96 \times 10^5$ S/cm) than in the case of a pure copper film, and these values may be because the embodiments have a plate-shaped laminated structure (the pure copper film does not have a plate-shaped laminated structure, and thus has a density of about 8.96 g/$cm^3$, which is large). Accordingly, it is expected that the shielding film according to the present invention having a density of about ⅓ level as compared with the pure copper film will have better electric conductivity at the same loading amount.

Among the nanofiller materials capable of forming such a laminated structure, it has the best electric conductivity value. In particular, since Mxene has an electric conductivity of about 4600 S/cm, which is smaller than the electric conductivity of the shielding film of the embodiment, it was confirmed that the shielding film according to the present invention has excellent shielding efficiency and electric conductivity at the same time.

Experimental Example 6: EMI Shielding Characteristic Analysis According to the Loading Amount of a Metal Nanoplate The electromagnetic wave shielding efficiency of the copper nanoplate shielding film manufactured according to Examples 14 to 20 was compared with the electromagnetic wave shielding efficiency of a copper thermal-deposited thin film loaded with the same amount of copper, and a copper foil. Herein, a thin film deposited on a substrate using a thermal evaporator was used for the copper thermal-deposited thin film, and a copper foil manufactured by the rolling method was used. After measurement and calculation in the same manner as in Experimental Example 2, the results are shown in FIGS. 25 and 26.

Figure 25:
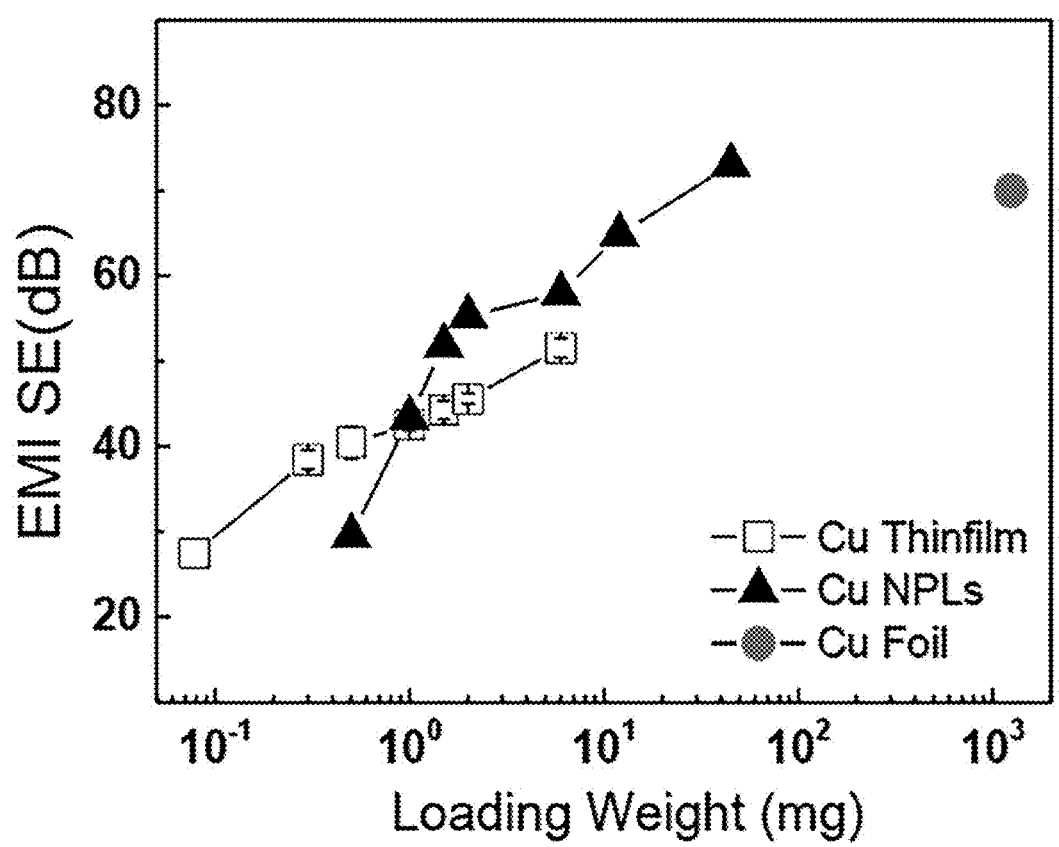
FIG. 25 is a graph comparing the EMI SE of an electromagnetic wave shielding film according to the present invention and a copper single thin film thermally evaporated.
Figure 26:
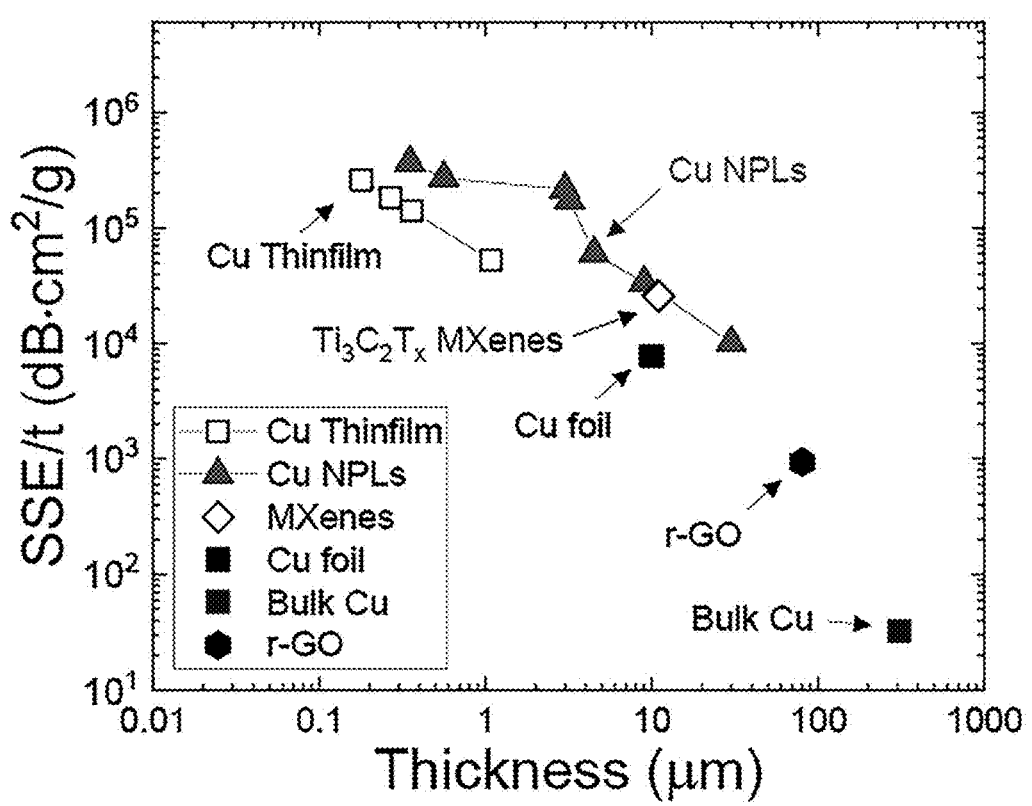
FIG. 26 is a graph comparing the SSE values of the electromagnetic wave shielding film according to the present invention with the conventional solution substrate electromagnetic wave shielding films.

Referring to FIG. 25, it was confirmed that the shielding film according to the embodiment of the present invention exhibits remarkably excellent EMI SE characteristics at the same metal loading amount. In particular, the increase of the EMI SE characteristics according to the loading amount is larger than that of the copper thermal-deposited thin film, and it was confirmed that the EMI SE characteristic is remarkably excellent starting from 1 mg/$cm^2$ or more. It is expected to have a difference of 10 dB or more at maximum. In addition, it was confirmed that a significantly smaller amount of copper loading is required to exhibit a similar level of EMI SE effect as compared to copper foil.

With respect to such effects, the embodiment of the present invention has structural features of the plate-shaped laminated structure, which can make multiple reflections of electromagnetic waves, and thus exhibits remarkably excellent EMI SE characteristics in the same loading amount as compared to a single thin film manufactured by the conventional thermal deposition method.

Experimental Example 7: Analysis of Heat Dissipation Characteristics

The same process as in Example 1 was carried out except that glass fiber other than the polyimide substrate was used to prepare a specimen (Example 21). The thermal conductivity was measured using a Joule heating and a thermal imaging camera of the specimen prepared by preparing the specimen with copper thermally deposited on glass fiber (Example 22).

Figure 27:
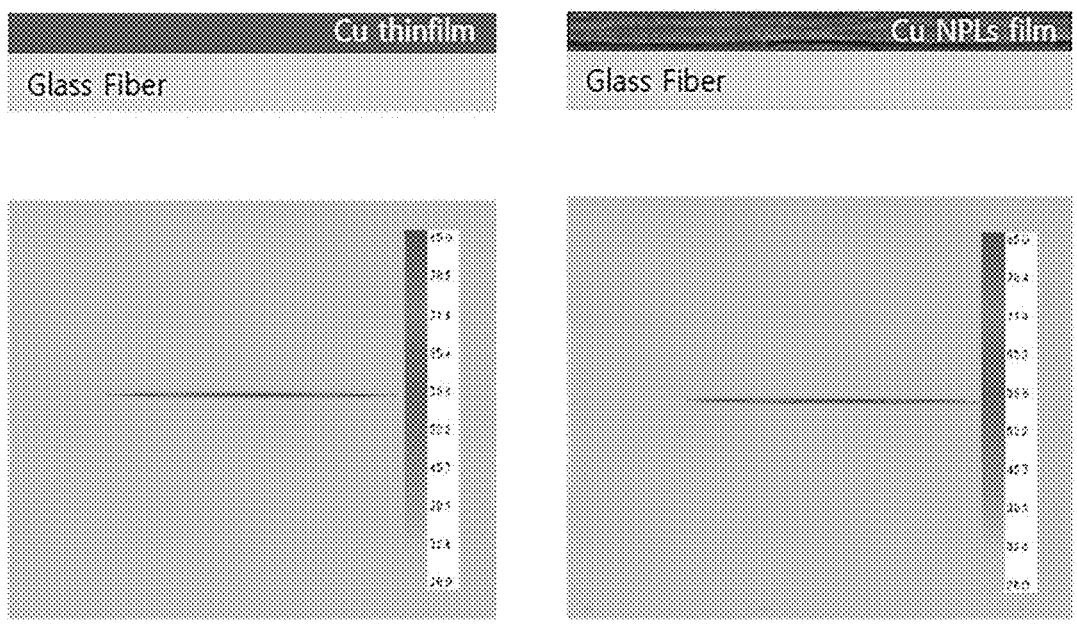
FIG. 27 illustrates a photograph of a thermal imaging camera measuring the thermal conductivity of an electromagnetic wave shielding film and a copper single thin film according to the present invention.

Referring to FIG. 27, it was possible to confirm the temperature distribution caused by Joule heating by flowing current to each specimen.

Figure 28:
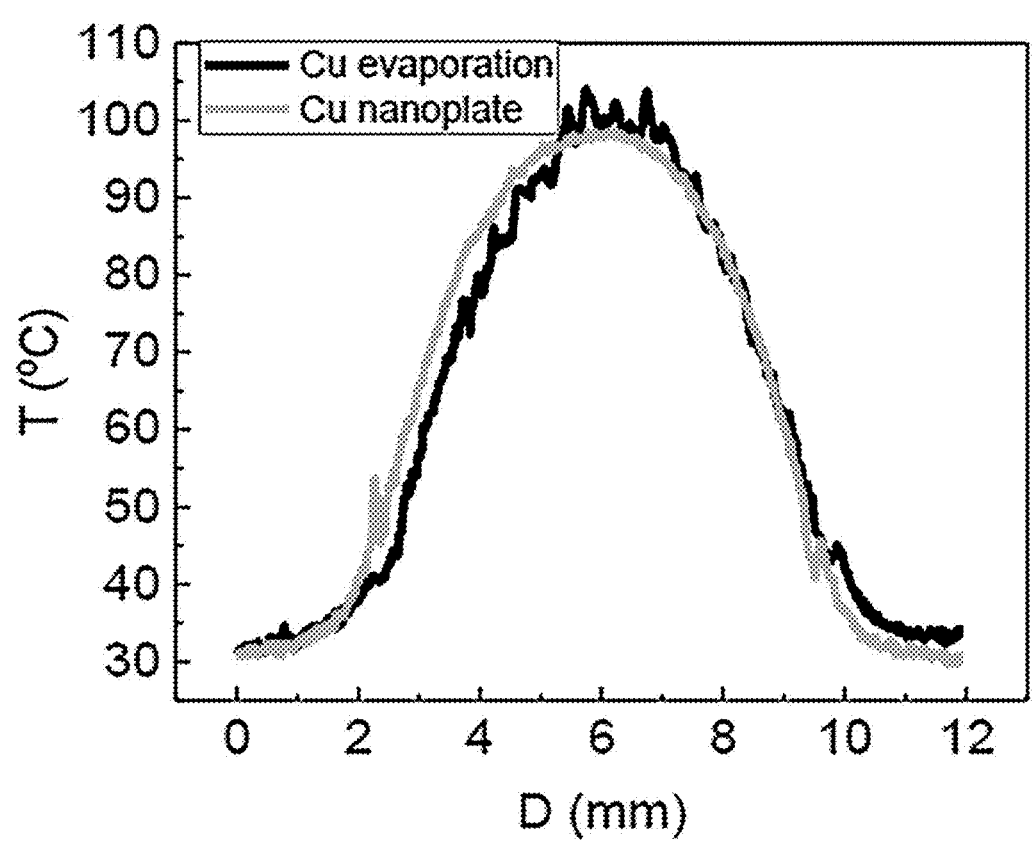
FIG. 28 is a graph showing the thermal conductivity of a film coated by thermal evaporation of the electromagnetic wave shielding film and copper according to the present invention.

Referring to FIG. 28, it was confirmed that there is only a difference in smoothness of the temperature distribution depending on the difference in surface roughness of the coated glass fiber, but there is no significant difference other than the above.

From these results, it was confirmed that Examples 21 and 22 have similar thermal conductivity, and accordingly, it was confirmed that the shielding film of the present invention has good heat dissipation characteristics.

The embodiments of the present invention described above should not be construed as limiting the technical idea of the present invention. The scope of protection of the present invention is limited only by the matters described in the claims, and those skilled in the technical field of the present invention will be able to modify the technical idea of the present invention in various forms. Accordingly, such improvements and modifications will fall within the scope of protection of the present invention as long as it is obvious to those skilled in the art.

The invention claimed is:

1. An electromagnetic wave shielding film, comprising:
   a substrate; and
   an electromagnetic wave shielding layer disposed on the substrate and comprising a laminated structure having a planar shape and including a stack of metal nanoplates,
   wherein each metal nanoplate of the stack of metal nanoplates is staggered with respect to one or more other metal nanoplate of the stack of metal nanoplates so that the laminated structure has pores defined therein, and
   wherein the electromagnetic wave shielding layer comprises a plurality of laminated structures that are stacked and adjacent laminated structures of the plurality of laminated structures define pores therebetween so that the stack of laminated structures has pores defined therein.

2. An electromagnetic wave shielding film, comprising:
   an electromagnetic wave shielding layer comprising a composite of a polymer resin matrix comprised of a polymer and at least one metal nanoplate,
   wherein each metal nanoplate of the at least one metal nanoplate is staggered with respect to one or more other metal nanoplate of the at least one metal nanoplate so that the composite has pores defined therein, and
   wherein the electromagnetic wave shielding layer comprises a plurality of laminated structures that are stacked and adjacent laminated structures of the plurality of laminated structures define pores therebetween so that the stack of laminated structures has pores defined therein.

3. The electromagnetic wave shielding film according to claim 1, wherein the metal nanoplate has a face-centered cubic structure (FCC).

4. The electromagnetic wave shielding film according to claim 1, wherein each metal nanoplate of the stack of metal nanoplates extends in a plane that is a (111) crystal plane.

5. The electromagnetic wave shielding film according to claim 1, wherein the metal comprises copper, silver, platinum, gold, or a transition metal.

6. The electromagnetic wave shielding film of claim 1, wherein the laminated structure has a porosity of 20% or more.

7. The electromagnetic wave shielding film of claim 1, wherein the stack of metal nanoplates has a loading amount of 0.2-100 mg/cm$^2$.

8. The electromagnetic wave shielding film according to claim 1, wherein each metal nanoplate has a coverage of 95% or more based on a total area of the electromagnetic shielding film.

9. The electromagnetic wave shielding film according to claim 1, wherein the electromagnetic wave shielding layer has a thickness ranging from 50 nm to 500 μm.

10. The electromagnetic wave shielding film according to claim 1, wherein the electromagnetic wave shielding layer further comprises metal nanoparticles or metal nanowires.

11. The electromagnetic wave shielding film according to claim 1, wherein the electromagnetic wave shielding film is configured to dissipate heat.

12. A nano electrode comprising the electromagnetic wave shielding film according to claim 1.

13. The nano electrode according to claim 12, wherein the nano electrode is a patterned electrode including a pattern of electromagnetic wave shielding films.

14. The nano electrode according to claim 12, wherein the stack of metal nanoplates has a loading amount of 0.2-100 mg/cm$^2$.

15. The nano electrode according to claim 12, wherein each metal nanoplate has a coverage of 95% or more based on a total area of the electromagnetic shielding film.

* * * * *